United States Patent
Oosawa et al.

(10) Patent No.: US 12,482,714 B2
(45) Date of Patent: Nov. 25, 2025

(54) SEMICONDUCTOR DEVICE, SEMICONDUCTOR MODULE, AND METHOD FOR MANUFACTURING SEMICONDUCTOR DEVICE

(71) Applicant: DENSO CORPORATION, Kariya (JP)

(72) Inventors: Seigo Oosawa, Kariya (JP); Yasushi Ookura, Kariya (JP)

(73) Assignee: DENSO CORPORATION, Kariya (JP)

( * ) Notice: Subject to any disclaimer, the term of this patent is extended or adjusted under 35 U.S.C. 154(b) by 363 days.

(21) Appl. No.: 18/059,748

(22) Filed: Nov. 29, 2022

(65) Prior Publication Data
US 2023/0093554 A1 Mar. 23, 2023

Related U.S. Application Data

(63) Continuation of application No. PCT/JP2021/019433, filed on May 21, 2021.

(30) Foreign Application Priority Data
Jun. 5, 2020 (JP) .................... 2020-098220

(51) Int. Cl.
*H01L 23/31* (2006.01)
*H01L 21/56* (2006.01)
*H01L 23/00* (2006.01)
*H01L 23/36* (2006.01)

(52) U.S. Cl.
CPC .......... *H01L 23/3107* (2013.01); *H01L 21/56* (2013.01); *H01L 23/36* (2013.01); *H01L 24/48* (2013.01); *H01L 2224/48151* (2013.01)

(58) Field of Classification Search
CPC ............................ H01L 24/18; H01L 23/3135
See application file for complete search history.

(56) References Cited

U.S. PATENT DOCUMENTS

| | | | |
|---|---|---|---|
| 6,306,680 B1 | 10/2001 | Fillion et al. | |
| 6,703,707 B1 | 3/2004 | Mamitsu et al. | |
| 8,237,259 B2 | 8/2012 | Pressel et al. | |
| 12,334,408 B2 * | 6/2025 | Yoshimatsu | ........ H01L 23/3142 |
| 2003/0132530 A1 | 7/2003 | Teshima et al. | |
| 2004/0070060 A1 | 4/2004 | Mamitsu et al. | |
| 2004/0070072 A1 | 4/2004 | Mamitsu et al. | |

(Continued)

FOREIGN PATENT DOCUMENTS

| | | |
|---|---|---|
| CN | 102842556 A | 12/2012 |
| JP | 2014-157927 A | 8/2014 |

*Primary Examiner* — Yu-Hsi D Sun
(74) *Attorney, Agent, or Firm* — Posz Law Group, PLC

(57) ABSTRACT

A semiconductor device includes a semiconductor element, a sealing material, and an extension wire. The semiconductor element has, on a front surface, a first electrode pad and at least one second electrode pad, and generates a current in a direction connecting the front surface and a back surface. The sealing material is made of an insulating resin material and covers a part of the front surface and a side surface of the semiconductor element. The extension wire is disposed above the semiconductor element and inside the sealing material or on the sealing material. The extension wire is electrically connected to the second electrode pad, and extends from a position inside of a contour of the semiconductor element to a position outside of the contour of the semiconductor element.

11 Claims, 14 Drawing Sheets

(56) References Cited

U.S. PATENT DOCUMENTS

| | | |
|---|---|---|
| 2004/0089925 A1 | 5/2004 | Fukuda et al. |
| 2004/0089940 A1 | 5/2004 | Mamitsu et al. |
| 2004/0089941 A1 | 5/2004 | Mamitsu et al. |
| 2004/0089942 A1 | 5/2004 | Mamitsu et al. |
| 2004/0097082 A1 | 5/2004 | Mamitsu et al. |
| 2005/0019982 A1 | 1/2005 | Wakabayashi et al. |
| 2005/0167821 A1 | 8/2005 | Mamitsu et al. |
| 2006/0141669 A1 | 6/2006 | Wakabayashi et al. |
| 2019/0181125 A1 | 6/2019 | Cho |
| 2020/0075897 A1 | 3/2020 | Tanaka |
| 2020/0126925 A1 | 4/2020 | Michiaki et al. |
| 2020/0395278 A1* | 12/2020 | Harada ................. H01L 25/07 |
| 2022/0005743 A1 | 1/2022 | Osawa et al. |
| 2022/0109129 A1 | 4/2022 | Tanaka |
| 2024/0258188 A1* | 8/2024 | Saito ..................... H01L 24/32 |

* cited by examiner

SEMICONDUCTOR DEVICE, SEMICONDUCTOR MODULE, AND METHOD FOR MANUFACTURING SEMICONDUCTOR DEVICE

CROSS REFERENCE TO RELATED APPLICATIONS

The present application is a continuation application of International Patent Application No. PCT/JP2021/019433 filed on May 21, 2021, which designated the U.S. and claims the benefit of priority from Japanese Patent Application No. 2020-098220 filed on Jun. 5, 2020. The entire disclosures of all of the above applications are incorporated herein by reference.

TECHNICAL FIELD

The present disclosure relates to a semiconductor device having a fan-out package structure, a semiconductor module including a semiconductor device, and a method for manufacturing a semiconductor device.

BACKGROUND

For example, there is a semiconductor module including a semiconductor device as a power semiconductor element, two heat sinks disposed on opposite sides of the semiconductor device, a lead terminal, and a wire connecting the semiconductor device and the lead terminal. In the semiconductor module, in order to suppress a short-circuit due to contact between the wire and the heat sink, a heat dissipation block made of a high thermal conductive material is disposed between a surface of the semiconductor device on a side to which the wire is connected and the heat sink facing the surface.

SUMMARY

The present disclosure describes a semiconductor device, a semiconductor module having a semiconductor device, and a method for manufacturing a semiconductor device. According to an aspect, a semiconductor device includes a semiconductor element, a sealing material, and an extension wire. The semiconductor element has, on a front surface, a first electrode pad and a plurality of second electrode pads, and is configured to generate a current in a direction connecting the front surface and a back surface. The sealing material is made of an insulating resin material, and covers a part of the front surface and a side surface of the semiconductor element. The extension wire is disposed above the semiconductor element and inside the sealing material or on the sealing material, electrically connected to at least one of the second electrode pads, and extends from a position inside of a contour of the semiconductor element to a position outside of the contour of the semiconductor element.

DETAILED DESCRIPTION

Figure 1:
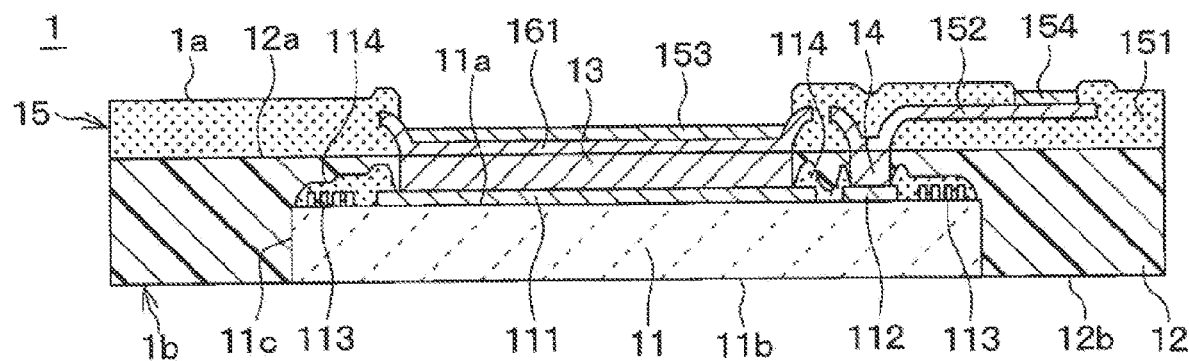
FIG. 1 is a cross-sectional view illustrating a configuration of a semiconductor device according to a first embodiment.

To begin with, a relevant technology will be described as a related art only for understanding the embodiments of the present disclosure.

For example, there is a semiconductor module including a semiconductor device as a power semiconductor element, two heat sinks disposed on opposite sides of the semiconductor device, a lead terminal, and a wire connecting the semiconductor device and the lead terminal. In order to suppress a short-circuit due to contact between the wire and the heat sink, a heat dissipation block made of a high thermal conductive material is disposed between a surface of the semiconductor device on a side to which the wire is connected and the heat sink facing the surface.

In such a semiconductor module, the contact between the wire and the heat sink may be suppressed by setting a gap between the semiconductor device and the heat sink to be equal to or greater than a predetermined value by use of the heat dissipation block, and thus, the heat dissipation block may be an obstructive factor of thinning. If the heat dissipation block is disposed between the semiconductor device and the heat sink, thermal resistance is likely to be increased by the heat dissipation block, and the heat dissipation of the semiconductor module is likely to be decreased.

The inventors of the present disclosure have intensively studied the structures of the semiconductor device and the semiconductor module in order to reduce the thickness of the semiconductor module and increase the heat dissipation of the semiconductor module. As a result, the inventors have devised a semiconductor module having a structure in which a semiconductor device has a fan-out package structure having a redistribution layer formed, heat sinks are bonded to opposite surfaces of the semiconductor device without a heat dissipation block interposed therebetween, and a lead terminal is connected to the redistribution layer without a wire interposed therebetween. Accordingly, the semiconductor module having a double-sided heat dissipation structure is obtained in which the heat dissipation block and the wire are not provided and the thickness is reduced and the heat dissipation is increased.

As a result of further intensive studies performed by the inventors of the present disclosure, it has been found that in the semiconductor device having the devised fan-out package structure, an insulating property in the semiconductor device may be insufficient due to a step between a side surface of a semiconductor element and a sealing material covering the side surface. Specifically, in this semiconductor device, when the step is generated between the side surface of the semiconductor element and the sealing material covering the side surface, there is a possibility that a crack due to the step is generated in a region covering the step in an insulation film forming the redistribution layer. When such a crack of the insulation film is generated, the insulating property between the wire formed on the step portion and the end of the semiconductor element cannot be secured.

The present disclosure provides a semiconductor device having a fan-out package structure, which is capable of suppressing a short-circuit between an extension wire disposed on a semiconductor element and the semiconductor element to improve the insulating property in the semiconductor device. The present disclosure also provides a semiconductor module having a double-sided heat dissipation structure in which the semiconductor device with an improved insulating property is used, reliability is high, and the decrease in thickness and high heat dissipation are achieved. The present disclosure further provides a method for manufacturing the semiconductor device.

According to a first aspect of the present disclosure, there is provided a semiconductor device including: a semiconductor element that has, on a front surface, a first electrode pad and a plurality of second electrode pads, and generates a current in a direction connecting the front surface and a back surface; a sealing material that is made of an insulating resin material and covers a part of the front surface and a side surface of the semiconductor element; and an extension wire that is disposed above the semiconductor element and inside the sealing material or on the sealing material, electrically connected to at least one of the second electrode pads, and extends from a position inside of a contour of the semiconductor element to an outside of the contour of the semiconductor element.

According to the first aspect, since the side surface and a part of the front surface of the semiconductor element are covered by the sealing material formed of the insulating resin material, a structure is obtained in which a step between the side surface of the semiconductor element and the sealing material covering the side surface is not generated. Therefore, the extension wire formed on a boundary between the side surface of the semiconductor element and the sealing material is not affected by the step between the side surface of the semiconductor element and the sealing material. Accordingly, an insulation failure caused by the step is suppressed, a short-circuit between the extension wire and the semiconductor element is suppressed, and the insulating property is improved.

According to a second aspect of the present disclosure, there is provided a semiconductor module including: a semiconductor device that includes a semiconductor element having, on a front surface, at least one first electrode pad and at least one second electrode pad and generates a current in a direction connecting the front surface and a back surface, a first sealing material made of an insulating resin material and covering a periphery of the semiconductor element including a part of the front surface, and an extension wire disposed on the semiconductor element and inside the first sealing material or on the first sealing material, electrically connected to the second electrode pad, and extending from a position inside of a contour of the semiconductor element to a position outside of the contour of the semiconductor element; a first heat dissipation member that is connected to the back surface of the semiconductor device exposed from the first sealing material via a bonding material; a second heat dissipation member that is electrically connected to the first electrode pad of the semiconductor device via the bonding material; a lead frame that is electrically connected to the extension wire of the semiconductor device via the bonding material; and a second sealing material that covers the semiconductor device, a part of the first heat dissipation member, a part of the second heat dissipation member, and a part of the lead frame.

According to the second aspect, the semiconductor module is obtained in which the first heat dissipation member and the second heat dissipation member are disposed to face each other with the semiconductor device according to the first aspect of the present disclosure interposed therebetween, and the lead frame is connected to the extension wire of the semiconductor device via the bonding material. The structure is obtained in which the semiconductor device and the lead frame are bonded to each other via the bonding material, there is no heat dissipation block for securing a gap between the second heat dissipation member and the semiconductor device, and decrease in thickness and increase in heat dissipation are obtained. Since the short-circuit between the extension wire and the semiconductor element in the semiconductor device is suppressed, the reliability is further improved. In the semiconductor device, in the exposed region located outside of the contour of the second heat dissipation member, the extension wire and the lead frame may be connected via the bonding material. Even in this case, the semiconductor module of which the configuration is further simplified, of which the thickness is decreased and of which heat dissipation is increased is obtained.

According to a third aspect of the present disclosure, there is provided a method for manufacturing a semiconductor device having a fan-out package structure, the method including: preparing a semiconductor element including, on a front surface, at least one first electrode pad and at least one second electrode pad; preparing a conductive member including a thick portion, a first thin portion extending from an upper end of the thick portion toward an outside and having a thickness smaller than a thickness of the thick portion, a middle portion provided at a distal end of the first thin portion, having a thickness smaller than the thickness of the thick portion and having a thickness larger than a thickness of the first thin portion, and a second thin portion extending from the middle portion toward a lower end of the thick portion and having a thickness smaller than the thickness of the thick portion; attaching a back surface of the semiconductor element to a support substrate; connecting a surface of the conductive member on a lower end side of the thick portion to the first electrode pad of the semiconductor element, and connecting a distal end of the second thin portion of the conductive member to the second electrode pad of the semiconductor element; forming a sealing material covering the semiconductor element, which has been attached to the support substrate and to which the conductive member is connected, together with the conductive member; and removing the sealing material from a surface of the sealing material on a side covering the conductive member to expose the thick portion and the middle portion of the conductive member from the sealing material. In the forming of the sealing material, an insulating resin material is used, and in the removing of the sealing material, the first thin portion of the conductive member is removed to separate the thick portion from the middle portion and the second thin portion.

According to the third aspect, after the conductive member is bonded to the first electrode pad and the second electrode pad of the semiconductor element, the sealing material is formed, and the sealing material and the first thin portion are removed to separate the thick portion from the middle portion and the second thin portion of the conductive member. As a result, a portion connected to the first electrode pad r and the extension wire connected to the second electrode pad are formed from one conductive member, and thus the semiconductor device having a fan-out package structure is manufactured. Therefore, since the conductive member including the extension wire is connected to the second electrode pad in advance before the formation of the sealing material, and the sealing material covering the front surface and the side surface of the semiconductor element together with the conductive member is formed, the step is not generated at the boundary between the side surface of the semiconductor element and the sealing material. Accordingly, the step between the side surface of the semiconductor element and the sealing material and the short-circuit between the extension wire and the semiconductor element, which is caused due to the step are not generated, and a semiconductor device with an improved insulating property can be manufactured.

Hereinafter, embodiments of the present disclosure will be described with reference to the drawings. In the following embodiments, the same or equivalent portions are denoted by the same reference numerals.

First Embodiment

A semiconductor device 1 according to the first embodiment will be described with reference to FIGS. 1 and 2. FIG. 1 is a cross-sectional view illustrating a configuration taken along line I-I in FIG. 2.

<Configuration>

As illustrated in FIG. 1, for example, the semiconductor device 1 of the present embodiment includes a semiconductor element 11, a sealing material 12, a first conductor portion 13, a second conductor portion 14, and a redistribution layer 15 having an extension wire 152 extending outward from a position inside of a contour, i.e., an outer end of the semiconductor element 11 on the semiconductor element 11. The semiconductor element 11 includes, on a front surface 11a, a first electrode pad 111, a plurality of second electrode pads 112, an electric field relaxation layer 113, and an on-element insulation film 114. The first conductor portion 13 is connected to the first electrode pad 111, and the second conductor portion 14 is connected to the second electrode pad 112. The extension wire 152 extends from the second conductor portion 14 to a position outside of the contour of the semiconductor element 11, and a partial region of the extension wire 152 in the vicinity a distal end thereof is exposed from the sealing material 12. The semiconductor device 1 has a fan-out package structure (hereinafter, referred to as "FOP structure") in which a part of the front surface 11a of the semiconductor element 11 is covered by the sealing material 12, and the redistribution layer 15 including the extension wire 152 is formed above one surface 12a of the sealing material 12.

For example, the semiconductor element 11 includes, on the front surface 11a, the first electrode pad 111 and a plurality of the second electrode pads 112, which are made of a metal material such as copper (Cu), the electric field relaxation layer 113, and the on-element insulation film 114 covering the electric field relaxation layer 113 and a part of the front surface 11a. The semiconductor element 11 is, for example, a power semiconductor element such as an insulated gate bipolar transistor (IGBT), and is manufactured by a normal semiconductor process. For example, a third electrode pad (not illustrated) is formed on a back surface 11b of the semiconductor element 11, and the third electrode pad is configured to be capable of being connected to other members. The first electrode pad 111 and the third electrode pad (not illustrated) form, for example, a pair of electrodes constituting an emitter electrode and a collector electrode, and serve as a current path in a direction connecting the front surface 11a and back surface 11b of the semiconductor element 11. At least one of a plurality of the second electrode pads 112 is a gate electrode, and is used to control on/off of a current between the first electrode pad 111 and the third electrode pad. As illustrated in FIG. 1, the first conductor portion 13 is connected to the first electrode pad 111. The second conductor portion 14 is connected to each of a plurality of the second electrode pads 112. A portion other than the back surface 11b of the semiconductor element 11 is covered by the sealing material 12. The electric field relaxation layer 113 is, for example, a guard ring, but is not limited to this.

As illustrated in FIG. 1, the sealing material 12 is a member that covers a portion other than the back surface 11b of the semiconductor element 11, and is made of an insulating resin material, for example, an arbitrary resin material such as an epoxy resin. Specifically, the sealing material 12 covers a part of the front surface 11a of the semiconductor element 11 including the on-element insulation film 114, and a side surface 11c between the front surface 11a and the back surface 11b, that is, a periphery. The sealing material 12 covers a part of the front surface 11a across the side surface 11c of the semiconductor element 11 when viewed from a normal direction with respect to the front surface 11a of the semiconductor element 11, and the contour of the sealing material 12 is located outside the contour of the semiconductor element 11. In other words, the outer shape of the sealing material 12 is larger than the outer shape of the semiconductor element 11. The one surface 12a of the sealing material 12 on a side covering the front surface 11a of the semiconductor element 11 is at a position higher than the surface 11a. The other surface 12b of the sealing material 12 opposite to the one surface 12a forms a back surface 1b of the semiconductor device 1 together with the back surface 11b of the semiconductor element 11. The one surface 12a of the sealing material 12 will also be referred to as a top surface of the sealing material 12.

The first conductor portion 13 and the second conductor portion 14 are formed of, for example, a conductive material such as Cu, and are formed by electrolytic plating or the like. As illustrated in FIG. 1, the first conductor portion 13 and the second conductor portion 14 extend in the normal direction with respect to the upper portion (for example, immediately above) of the semiconductor element 11, that is, the front surface 11a, and have a thickness that is equal to or greater than the height of the one surface 12a of the sealing material 12 in the present embodiment. A part of the first conductor portion 13 and a part of the second conductor portion 14 are disposed inside the redistribution layer 15.

One end of the first conductor portion 13 is connected to the first electrode pad 111, and the other end opposite to the one end is exposed from the sealing material 12. The surface of the first conductor portion 13 on the other end side is covered by, for example, a covering portion 161 formed of Cu and a metal thin film 153 formed of nickel (Ni), gold (Au).

One end of the second conductor portion 14 is connected to the second electrode pad 112, and the other end opposite to the one end is exposed from the sealing material 12. As illustrated in FIG. 1, the extension wire 152 extending from the position inside of the contour of the semiconductor element 11 to the position outside of the contour is connected to the other end of the second conductor portion 14. The second conductor portions 14 are formed as many as a plurality of the second electrode pads 112.

The redistribution layer 15 includes an insulation layer 151, the extension wire 152, and the covering portion 161, and is formed so as to cover the one surface 12a of the sealing material 12. The redistribution layer 15 is formed by, for example, a known redistribution layer forming technique. The redistribution layer 15 is not limited to the wiring example illustrated in FIG. 1, and may have a configuration in which a plurality of the insulating films and an internal wires are further stacked.

The insulation layer 151 is formed of, for example, an insulating material such as polyimide, and is formed by an arbitrary application process or the like. The insulation layer 151 is formed through a plurality of film formation processes and a patterning process by a photolithography etching method, and has a predetermined pattern shape that exposes a part of the extension wire 152 extending from the first conductor portion 13 and the second conductor portion 14. The insulation layer 151 is formed on the one surface 12a of the sealing material 12 that covers the on-element insulation film 114 and is a flat surface, and has a shape without a step caused by an interface (hereinafter, referred to as a "side surface interface") between the side surface 11c of the semiconductor element 11 and the sealing material 12. In other words, the insulation layer 151 has a shape capable of ensuring an insulating property between the semiconductor element 11 and the extension wire 152 without generating cracks caused by the side surface interface. This will be described later in detail.

In a portion of the insulation layer 151 closer to the one surface 12a side than the extension wire 152 (first layer 1511 to be described later), the thickness of the portion thereof is preferably greater than the thickness of a portion of the insulation layer 151 on an upper side of the extension wire 152 (second layer 1512 to be described later) from the viewpoint of securing the insulating property.

The extension wire 152 is formed of a conductive metal material containing, for example, Cu, Au, Ni, aluminum (Al), titanium (Ti), silver (Ag), palladium (Pd), tungsten (W), zinc (Zn), lead (Pb), or the like as a main component. The extension wire 152 extends from the second conductor portion 14 and is formed by, for example, electrolytic plating or electroless plating. The extension wire 152 is disposed on the semiconductor element 11 and on the one surface 12a of the sealing material 12 with a part of the insulation layer 151 interposed therebetween, and has a wire length across the inside and the outside of the contour of the semiconductor element 11. For example, the extension wires 152 are formed in the same number as that of the second conductor portions 14, and extend from the second conductor portions 14 located inside the contour of the semiconductor element 11 to the outside of the contour. Each of the extension wires 152 includes, as a predetermined region, a partial region in the vicinity of the distal end on the opposite side of the second conductor portion 14 outside the contour of the semiconductor element 11, and the predetermined region is exposed from the insulation layer 151 and covered by a metal thin film 154 formed of Au or the like. The extension wire 152 is preferably thicker than the second electrode pad 112 from the viewpoint of reducing impedance.

Figure 2:
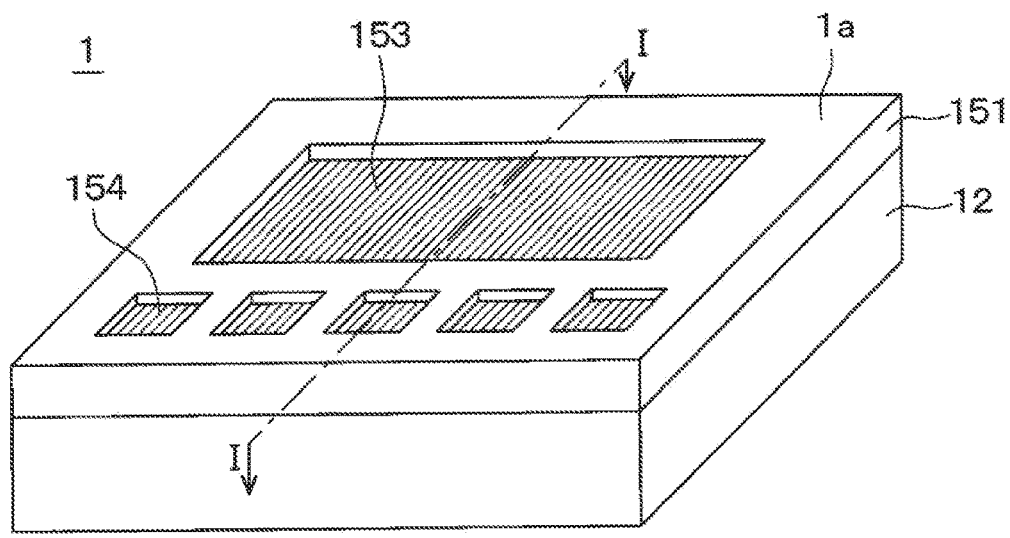
FIG. 2 is a perspective view illustrating a state in which the semiconductor device of FIG. 1 is viewed from a front surface side.

As illustrated in FIG. 2, the metal thin films 153 and 154 are exposed from the insulation layer 151, and function as external electrodes that can be connected to the first electrode pad 111 and the second electrode pad 112 from the outside. The metal thin films 153 and 154 are electrode portions exposed to the outside on the side opposite to the first electrode pad 111 or the second electrode pad 112, and can be referred to as a "first external electrode" and a "second external electrode", respectively. The metal thin film 153 is disposed at a distance from the metal thin film 154, and has an outer shape and a planar size, which are larger than those of the metal thin film 154. In the example of FIG. 2, a plurality of the metal thin films 154 have the same outer shape and plane size and are evenly disposed, but the present disclosure is not limited to this, and a plurality of the metal thin films 154 may have different outer shapes and plane sizes or may be unevenly disposed. The metal thin films 153 and 154 may have any configuration as long as the metal thin films 153 and 154 are exposed to the outside of the redistribution layer 15 and can be used for connection with the outside, and may be plated layers formed of Ni, Au, or the like, or may be bumps formed of solder or the like.

As described above, the example of the basic configuration of the semiconductor device 1 of the present embodiment has been described. The semiconductor device 1 has a FOP structure in which the redistribution layer 15 is formed via the sealing material 12 covering the front surface 11a of the semiconductor element 11, and the step due to a boundary between the side surface 11c of the semiconductor element 11 and the sealing material 12 is not generated in the redistribution layer 15. Accordingly, a short-circuit between the semiconductor element 11 and the extension wire 152 is suppressed, and thus, in the semiconductor device 1, the insulating property between the semiconductor element 11 and the extension wire 152 is improved and reliability is enhanced as compared with a semiconductor device having a FOP structure of the related art.

<Manufacturing Method>

Next, an example of the manufacturing method of the semiconductor device 1 of the present embodiment will be described with reference to FIGS. 3A to 3J.

Figure 3A:
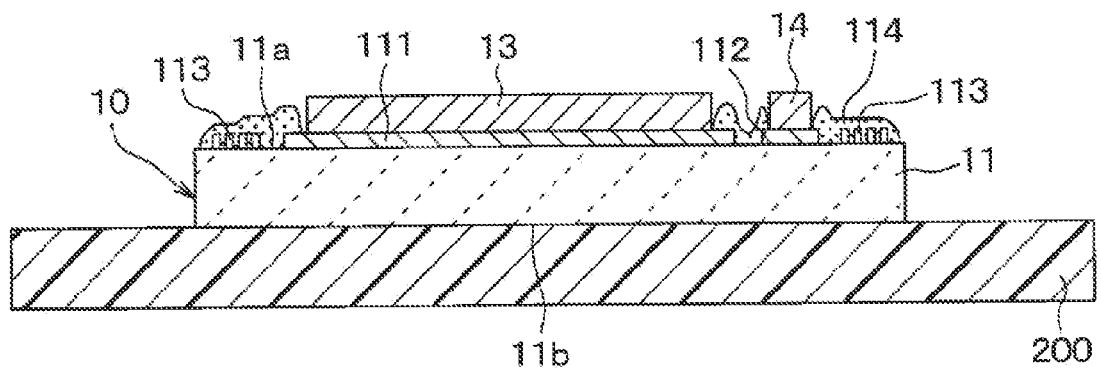
FIG. 3A is a cross-sectional view illustrating a temporary fixing process of a semiconductor substrate in a manufacturing process of the semiconductor device according to the first embodiment.

First, the semiconductor substrate 10 is prepared which includes, on the front surface 11a of the semiconductor element 11, the first electrode pad 111, the second electrode pad 112, and the on-element insulation film 114 covering the electric field relaxation layer 113 and the electric field relaxation layer 113. Next, the first conductor portion 13 is formed on the first electrode pad 111 of the semiconductor substrate 10 and the second conductor portion 14 is formed on the second electrode pad 112 by, for example, electrolytic plating or the like. As illustrated in FIG. 3A, the back surface 11b of the semiconductor element 11 in the semiconductor substrate 10 on which the conductor portions 13 and 14 are formed is attached to a support substrate 200 to perform temporary fixing. As the support substrate 200, for example, any substrate including an adhesive sheet (not illustrated) having high adhesion to silicon (Si) on the surface thereof is used.

Figure 3B:
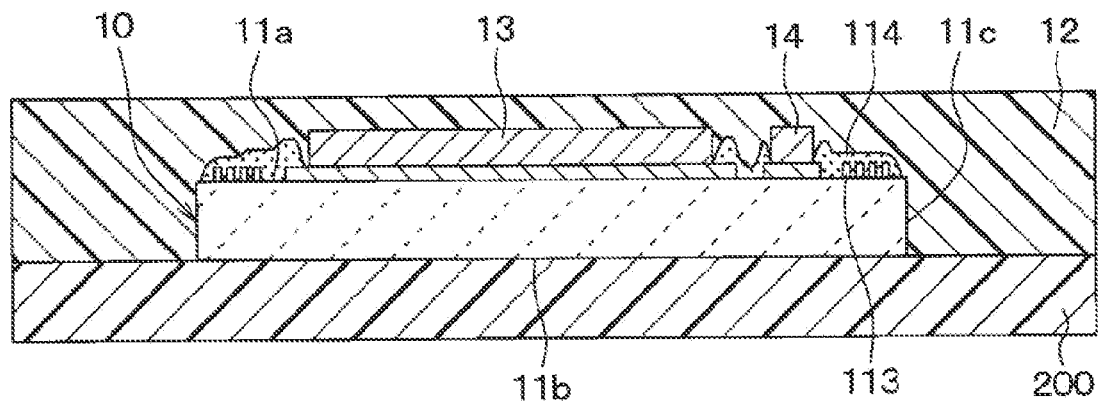
FIG. 3B is a cross-sectional view illustrating a manufacturing process subsequent to FIG. 3A.

Subsequently, a mold (not illustrated) is prepared, the semiconductor substrate 10 held by the support substrate 200 is covered with a resin material such as an epoxy resin by compression molding, and is cured by heating, and thus, as illustrated in FIG. 3B, the sealing material 12 is molded. Accordingly, the sealing material 12 that covers the front surface 11a and the side surface of the semiconductor element 11 together with the conductor portions 13 and 14 is formed. Thereafter, the semiconductor substrate 10 covered by the sealing material 12 is peeled off from the support substrate 200 by, for example, heat treatment.

Figure 3C:
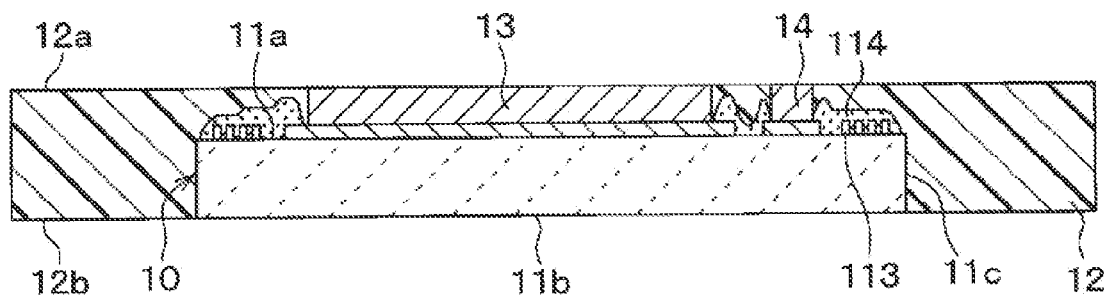
FIG. 3C is a cross-sectional view illustrating a manufacturing process subsequent to FIG. 3B.

Next, as illustrated in FIG. 3C, the sealing material 12 is removed from the surface covering the front surface 11a side of the semiconductor element 11, and the first conductor portion 13 and the second conductor portion 14 are exposed from the sealing material 12. Accordingly, on the sealing material 12, the flat one surface 12a covering the on-element insulation film 114 and a part of the front surface 11a is formed, and the sealing material 12 has a shape without a step caused by the on-element insulation film 114. The removal of the sealing material 12 may be performed by, for example, a method of grinding using a grinding tool such as a grinder (not illustrated), or may be performed by any other methods such as cutting, etching, or polishing, and is not particularly limited.

Figure 3D:
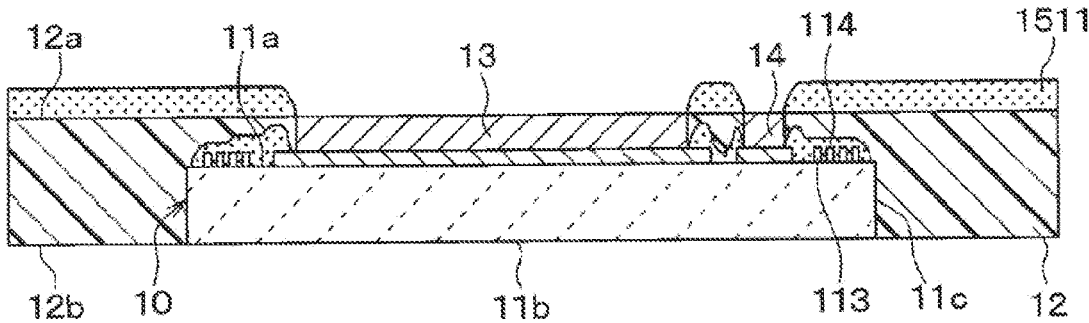
FIG. 3D is a cross-sectional view illustrating a manufacturing process subsequent to FIG. 3C.

For example, a solution containing a resin material such as polyimide is applied by a spin coating method and dried to form a first layer 1511 forming a part of the insulation layer 151 as illustrated in FIG. 3D. The first layer 1511 has a predetermined pattern shape that exposes at least a part of the first conductor portion 13 and at least a part of the second conductor portion 14 of the semiconductor substrate 10 and covers the one surface 12a of the sealing material 12 by patterning by a photolithography etching method.

The first layer 1511 formed on the flat one surface 12a has a shape without an interface step across the side surface of the semiconductor element 11 and the sealing material 12 even when the first layer 1511 is a portion located on the on-element insulation film 114, and the extension wire 152 to be formed on the first layer 1511 later is not adversely affected.

Figure 3E:
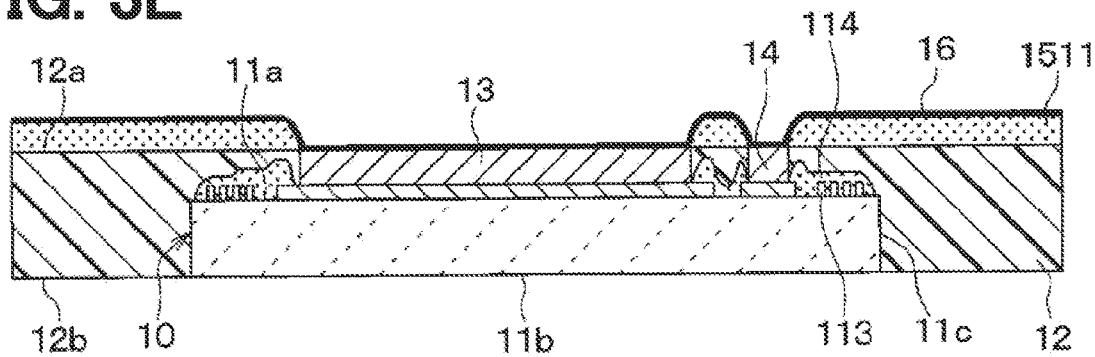
FIG. 3E is a cross-sectional view illustrating a manufacturing process subsequent to FIG. 3D.
Figure 3F:
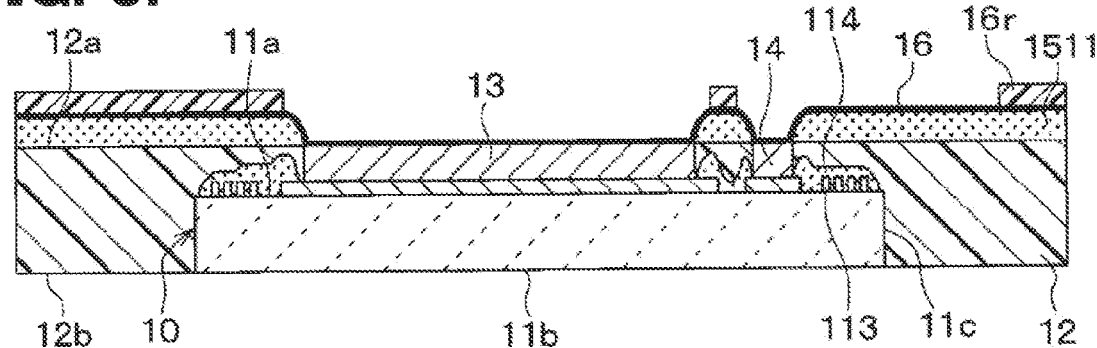
FIG. 3F is a cross-sectional view illustrating a manufacturing process subsequent to FIG. 3E.
Figure 3G:
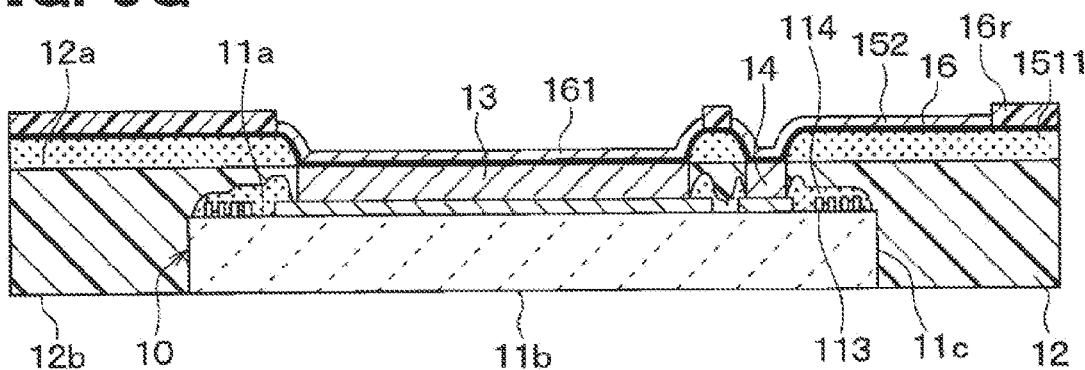
FIG. 3G is a cross-sectional view illustrating a manufacturing process subsequent to FIG. 3F.

Thereafter, for example, as illustrated in FIG. 3E, a seed layer 16 that covers exposed portions of the first layer 1511 and the semiconductor substrate 10 is formed by vacuum film formation method such as a sputtering method. The seed layer 16 is formed of, for example, a conductive material such as Cu. Thereafter, for example, as illustrated in FIG. 3F, an insulating resist layer 16r having a predetermined pattern shape partially covering the seed layer 16 is formed by a process similar to that of the first layer 1511. Thereafter, as illustrated in FIG. 3G, the covering portion 161 that covers at least a part of the first conductor portion 13 and the extension wire 152 that covers a part of the first layer 1511 and of which at least a part is connected to the second conductor portion 14 are formed by, for example, electrolytic plating. For example, in the case of electrolytic plating, the covering portion 161 and the extension wire 152 are made of a conductive metal material such as Cu.

Figure 3H:
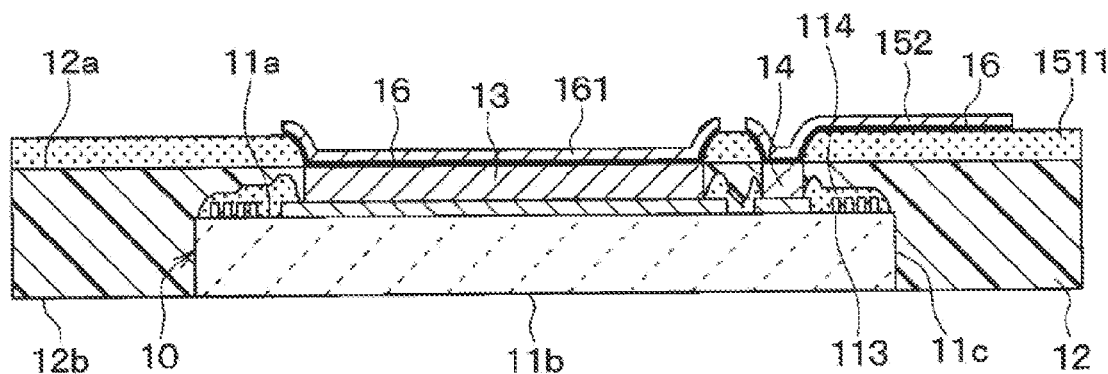
FIG. 3H is a cross-sectional view illustrating a manufacturing process subsequent to FIG. 3G.

Subsequently, for example, the resist layer 16r is removed by a peeling solution, and the seed layer 16 is exposed from the resist layer 16r. Then, a portion of the seed layer 16 covered by the resist layer 16r is removed using, for example, an etching solution. As a result, as illustrated in FIG. 3H, the covering portion 161 covering the first conductor portion 13 and the extension wire 152 covering the second conductor portion 14 and extending from the inside to the outside of the contour of the semiconductor element 11 are formed.

Figure 3I:
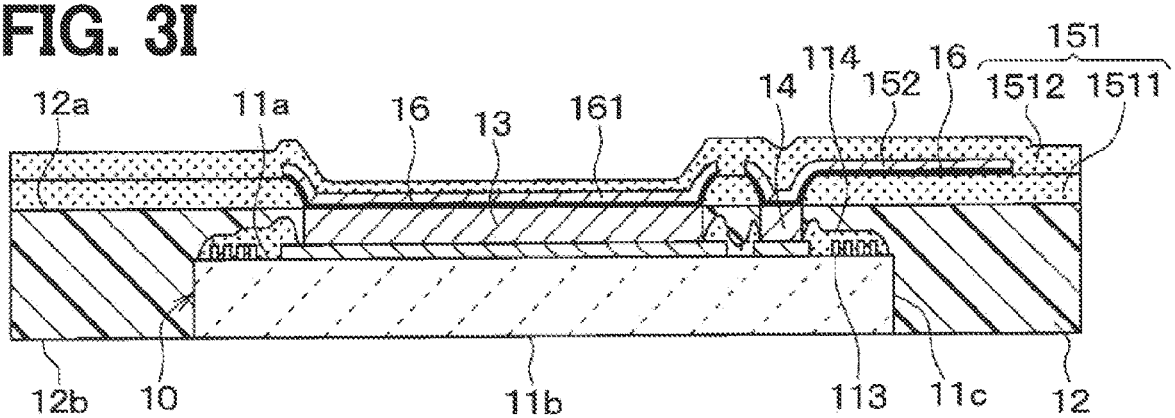
FIG. 3I is a cross-sectional view illustrating a manufacturing process subsequent to FIG. 3H.

Next, for example, as illustrated in FIG. 3I, a second layer 1512, which is the remaining portion of the insulation layer 151, is formed by a spin coating method using an insulating resin material similar to that of the first layer 1511.

Figure 3J:
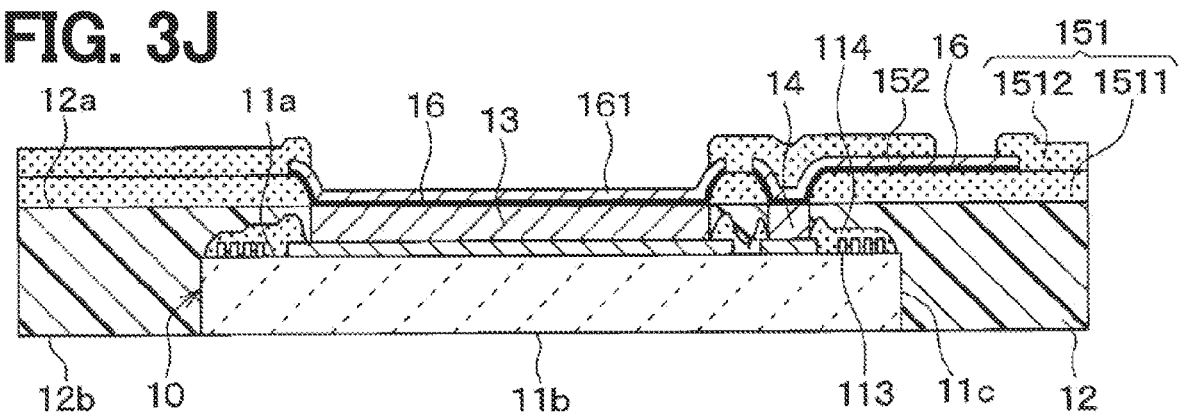
FIG. 3J is a cross-sectional view illustrating a manufacturing process subsequent to FIG. 3I.

Then, the second layer 1512 is patterned by a photolithography etching method, and an unnecessary portion of the second layer 1512 is removed to form a predetermined pattern shape as illustrated in FIG. 3J. Specifically, a part of the second layer 1512 covering a predetermined region of the covering portion 161 located on the first conductor portion 13 and a partial region of the extension wire 152 in the vicinity of the distal end opposite to the second conductor portion 14 is removed, and the covering portion 161 and a part of the extension wire 152 are exposed to the outside. As a result, the insulation layer 151 forming the redistribution layer 15 is formed.

Finally, the metal thin films 153 and 154 covering the portions of the covering portion 161 and the extension wire 152 exposed from the second layer 1512 are formed by, for example, electroless plating.

For example, the semiconductor device 1 of the present embodiment can be manufactured by the above-described processes.

<Modification of Manufacturing Method>

The above-described manufacturing method is merely an example, and the present disclosure is not limited to this. For example, the covering portion 161 and the extension wire 152 may be formed by a screen printing method instead of the electrolytic plating.

Figure 4A:
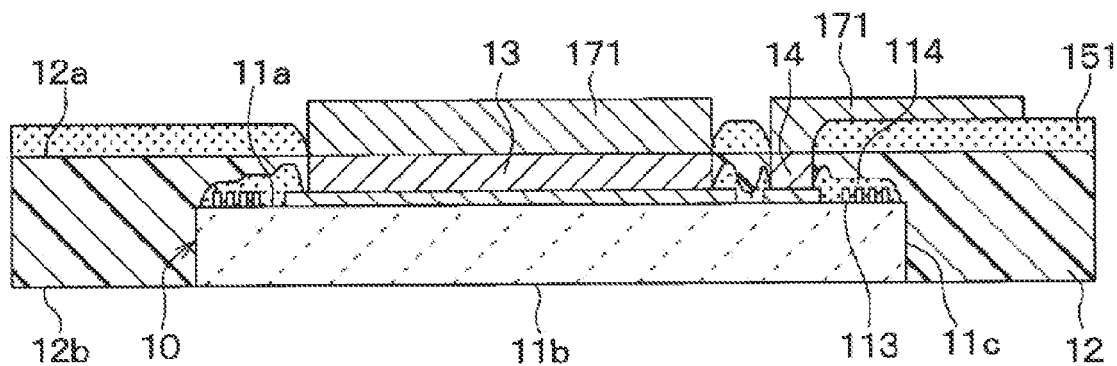
FIG. 4A is a view illustrating an example of another manufacturing method of a redistribution layer of the semiconductor device according to the first embodiment, and is a cross-sectional view illustrating a manufacturing process subsequent to FIG. 3D.

For example, as illustrated in FIG. 4A, after the process illustrated in FIG. 3D, a print layer 171 may be formed by screen printing using a screen mask and a conductive paste material (which are not illustrated), and baked to form the covering portion 161 and the extension wire 152. As the conductive paste material, for example, sintered Ag, a Cu paste material, an Ag paste material, or the like can be used.

Figure 4B:
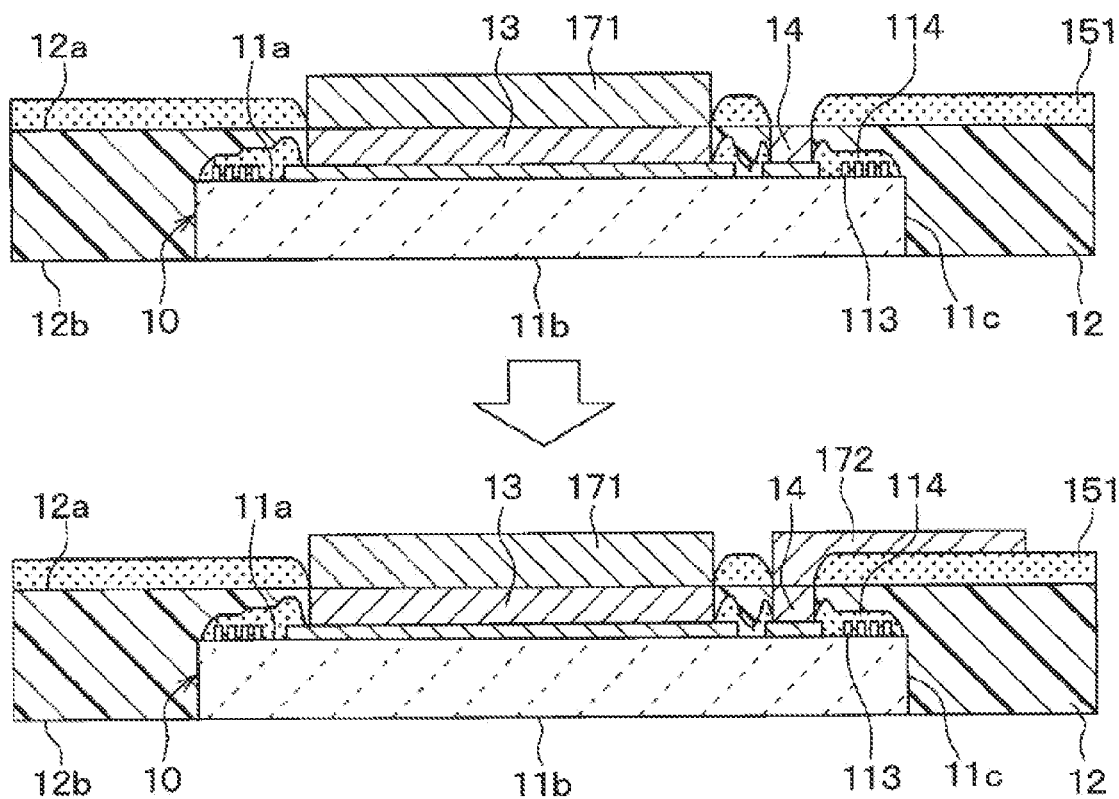
FIG. 4B is a view illustrating a modification of the manufacturing process of FIG. 4A, and is a view illustrating a manufacturing process subsequent to FIG. 3D.

The covering portion 161 and the extension wire 152 may be made of different materials. In this case, for example, as illustrated in FIG. 4B, after a first print layer 171 covering the first conductor portion 13 is formed by screen printing, a second print layer 172 covering the second conductor portion 14 and extending to the outside of the contour of the semiconductor element 11 is formed. Thereafter, by performing a baking treatment, the covering portion 161 and the extension wire 152 made of different conductive materials can be formed.

For example, the covering portion 161 connected to the first electrode pad 111 serving as an emitter electrode can be formed using a sintered Cu paste material. On the other hand, the extension wire 152 connected to the second electrode pad 112 serving as a gate electrode or another signal terminal and having a longer wire length can be formed using a conductive paste material having a lower stress than the covering portion 161. In a case where the covering portion 161 and the extension wire 152 are formed by the screen printing, the number of processes is reduced as compared with the redistribution layer forming technique, and the covering portion 161 and the extension wire 152 can be thickened (although not limited, for example, 20 μm or greater, and the like) as compared with the electrolytic plating. In the case of screen printing, it is also easy to form a plurality of the wires having different properties of the wires, which are required depending on the formation site of the wires, the wire length, and the like.

The semiconductor device 1 of the present embodiment may be manufactured by forming the covering portion 161 and the extension wire 152 according to the above-described modification.

<Effects>

Figure 5:
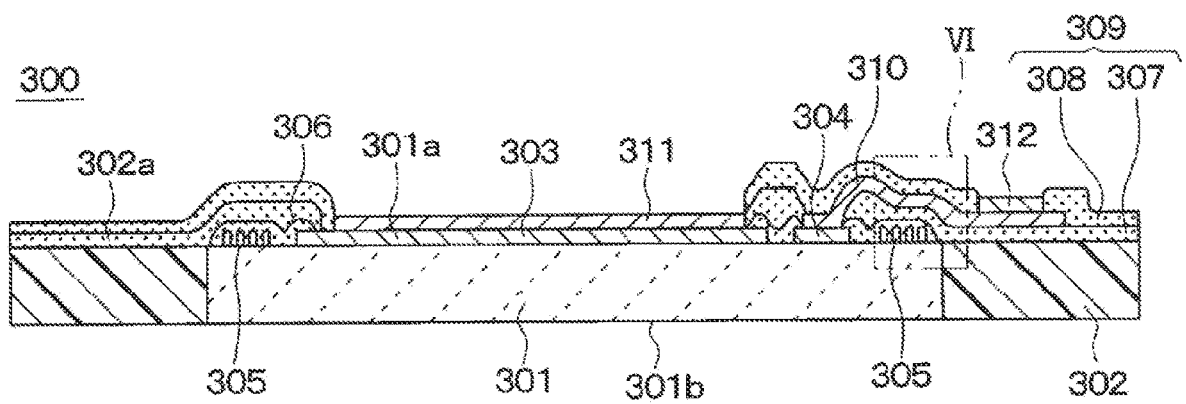
FIG. 5 is a cross-sectional view illustrating a configuration of a semiconductor device in a related art.
Figure 6:
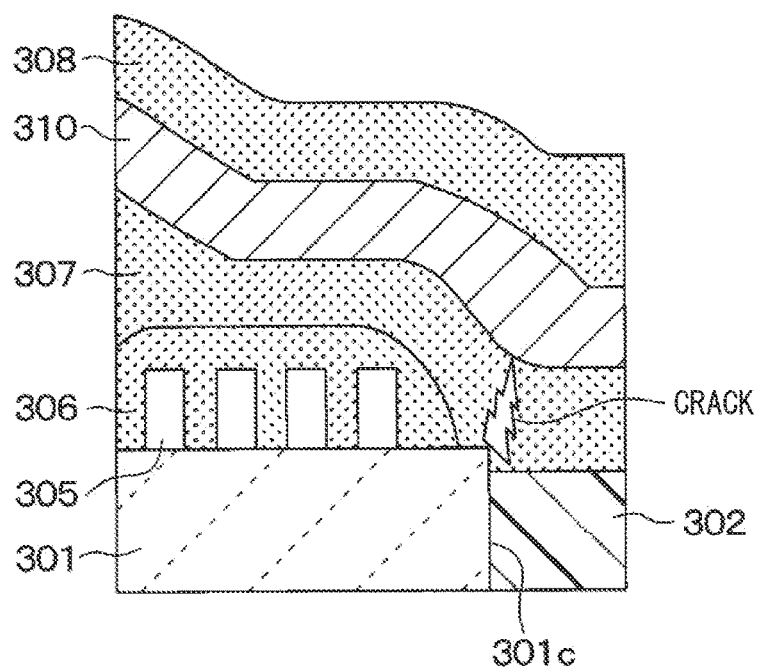
FIG. 6 is an enlarged cross-sectional view illustrating a VI region of FIG. 5.

Here, the reason why the short-circuit between the extension wire 152 and the semiconductor element 11 is suppressed in the semiconductor device 1 of the present embodiment will be described with reference to FIGS. 5 and 6 illustrating a semiconductor device 300 of which a front surface is not covered by a sealing material 302 (hereinafter, simply referred to as a "semiconductor device 300").

First, a configuration of the semiconductor device 300 will be briefly described.

For example, as illustrated in FIG. 5, the semiconductor device 300 includes a semiconductor element 301 having, on a front surface 301a, a first electrode 303, a second electrode 304, an electric field relaxation layer 305, and an on-element insulation film 306 covering the electric field relaxation layer 305, and a sealing material 302 covering a side surface of the semiconductor element 301. The semiconductor device 300 includes an insulation layer 309 that covers a part of the front surface 301a of the semiconductor element 301 and one surface 302a of the sealing material 302, a covering portion 311 that covers the first electrode 303, an extension wire 310 that extends from the second electrode 304, and a metal thin film 312 that covers a part of the extension wire 310. The semiconductor device 300 has a FOP structure, and can transmit an electric signal to the second electrode 304 via the metal thin film 312 exposed to the outside at a position outside of the contour of the semiconductor element 301.

The semiconductor device 300 has a structure in which a portion of the insulation layer 309 closer to the semiconductor element 301 or the sealing material 302 than the extension wire 310 is a first layer 307, and the remaining portion is a second layer 308, and a step can be generated at an interface between the semiconductor element 301 and the sealing material 302 in the first layer 307. In a case where such a step is generated, in the semiconductor device 300, a portion of the first layer 307, which covers the step, becomes thinner than other portions due to the step in the interface between the semiconductor element 301 and the sealing material 302. In this case, the step in the interface between the semiconductor element 301 and the sealing material 302 becomes thinner than the step in the interface between the sealing material 302 and the on-element insulation film 306, and thus there is a possibility that a short-circuit between the extension wire 310 and the semiconductor element 301 occurs.

Specifically, for example, as illustrated in FIG. 6, a portion of the first layer 307, which covers a step between a side surface 301c of the semiconductor element 301 and the sealing material 302 is in a state of being partially thinner than other portions. A locally thinned portion of the first layer 307 can be cracked on the interface between the side surface 301c of the semiconductor element 301 and the sealing material 12 due to a factor such as thermal stress.

Hereinafter, for convenience of description, a crack generated due to the step between the side surface of the semiconductor element and the sealing material covering the side surface is referred to as "step-cut" in the insulation layer serving as a base of the extension wire.

When the crack, that is, a step cut as illustrated in FIG. 6 is generated in the first layer 307, the insulation property of the step-cut portion cannot be secured, the short-circuit occurs between the extension wire 310 and the semiconductor element 301, and the reliability may be lowered.

In the semiconductor device 300, the front surface 301a is attached to a support substrate (not illustrated) and temporarily fixed, the sealing material 302 covering a back surface 301b and the side surface is formed, and then the back surface 301b is exposed by a process of removing the sealing material 302. Thereafter, the semiconductor device 300 is obtained by forming a redistribution layer including the insulation layer 309 and the extension wire 310 on the front surface 301a by a known redistribution layer forming technique. In this case, in a case where the sealing material 302 is made of an insulating resin material containing fine particles such as a heat dissipation filler, when the fine particles enter between the front surface 301a and the support substrate (not illustrated), the fine particles may be present on the front surface 301a at the time of forming the redistribution layer. Then, instead of the step at a side surface interface between the side surface 301c of the semiconductor element 301 and the sealing material 302, a step due to fine particles such as a heat dissipation filler is generated, and a step-cut due to the step of the heat dissipation filler may occur in the first layer 307.

On the other hand, the semiconductor device 1 of the present embodiment has a structure in which the sealing material 12 covers the on-element insulation film 114, has the flat one surface 12a located at a position higher than the front surface 11a of the semiconductor element 11, and the insulation layer 151 and the extension wire 152 are formed on the one surface 12a. Therefore, in the first layer 1511 serving as a base of the extension wire 152, a portion having a locally small thickness is not generated due to the step in the side surface interface between the side surface 11c of the semiconductor element 11 and the sealing material 12, and the step-cut is suppressed, and thus the insulating property is secured.

In the semiconductor device 1, the back surface 11b side of the semiconductor element 11 on which the conductor portion 13 and the conductor portion 14 are formed is temporarily fixed to the support substrate 200, the sealing material 12 covering the front surface 11a and the side surface is formed, and then the one surface 12a of the sealing material 12 is formed by grinding the sealing material 12. Therefore, even in a case where an insulating resin material containing fine particles such as a heat dissipation filler is used as the sealing material 12, the step due to the fine particles is not generated on the one surface 12a, and the step-cut due to the fine particles in the sealing material 12 does not occur.

Accordingly, the semiconductor device 1 has a structure in which the insulating property is secured in a part of the insulation layer 151 serving as the base of the extension wire 152, the short-circuit between the extension wire 152 and the semiconductor element 11 is suppressed, and the reliability is improved.

<Configuration Example of Semiconductor Module>

Figure 7:
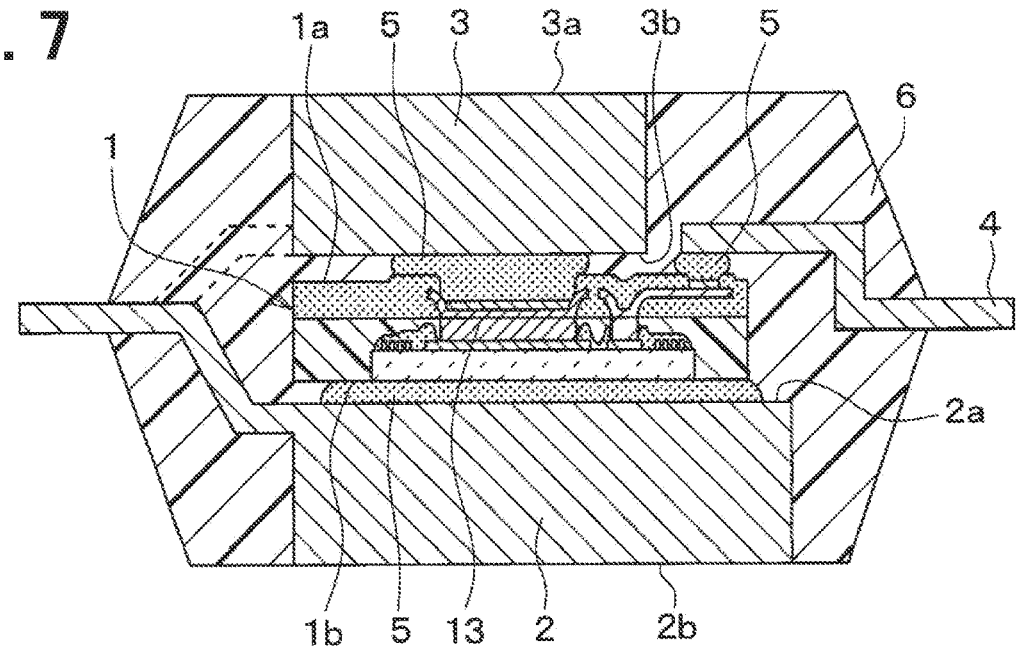
FIG. 7 is a cross-sectional view illustrating an example of a semiconductor module using the semiconductor device according to the first embodiment.

Next, an example of the semiconductor module using the semiconductor device 1 of the present embodiment will be described with reference to FIG. 7. In FIG. 7, a wire portion connected to the outside in another cross section of a second heat sink 3 to be described later is indicated by a broken line.

For example, as illustrated in FIG. 7, when the semiconductor device 1 is applied to a semiconductor module having a double-sided heat dissipation structure, the semiconductor module can be thinned and increased in heat dissipation, which is preferable. In the present specification, a case where the semiconductor device 1 is applied to the semiconductor module having a double-sided heat dissipation structure will be described as a representative example, but the present disclosure is not limited to this application example.

As illustrated in FIG. 7, the semiconductor module includes the semiconductor device 1, a first heat sink 2, a second heat sink 3, a lead frame 4, a bonding material 5, and a sealing material 6. The semiconductor module has a double-sided heat dissipation structure in which two heat sinks 2 and 3 are disposed to be opposed to each other with the semiconductor device 1 interposed therebetween, and heat generated in the semiconductor device 1 is released from both surfaces to the outside through the heat sinks 2 and 3.

In the semiconductor device 1, for example, as illustrated in FIG. 7, the back surface 1b side is connected to the first heat sink 2, and the metal thin film 153 covering the first conductor portion 13 on the front surface 1a side is connected to the second heat sink 3 via the bonding material 5. For example, the semiconductor device 1 is disposed such that the entire region of the back surface 1b is accommodated inside the contour of an upper surface 2a of the first heat sink 2. By setting a surface of the second heat sink 3 exposed to the outside as one surface 3a, and a surface facing the semiconductor device 1 as the other surface 3b, in the semiconductor device 1, for example, at least a portion of the extension wire 152, which is covered by the metal thin film 154, is disposed outside the contour of the other surface 3b of the second heat sink 3. The extension wire 152 of the semiconductor device 1 is electrically connected to the lead frame 4 via the bonding material 5 in a region outside the contour of the second heat sink 3.

As illustrated in FIG. 7, the first heat sink 2 has a plate shape including the upper surface 2a and a lower surface 2b which have a front and back relationship, and is made of, for example, a metal material such as Cu or iron (Fe). The semiconductor device 1 is mounted on the upper surface 2a of the first heat sink 2 via the bonding material 5 formed of solder, and the lower surface 2b of the first heat sink 2 is exposed from the sealing material 6. The first heat sink 2 is, for example, a current path for applying a current to the semiconductor device 1, and a part of the first heat sink 2 on the upper surface 2a side extends to the outside of the sealing material 6. That is, in the present embodiment, the first heat sink 2 serves two roles of a heat dissipation member and a wire. The first heat sink 2 may be referred to as a "first heat dissipation member".

As illustrated in FIG. 7, the second heat sink 3 has a plate shape including the one surface 3a and the other surface 3b which have a front and back relationship, and is made of, for example, the same material as that of the first heat sink 2. The other surface 3b of the second heat sink 3 is disposed to face a part of the upper surface 2a of the semiconductor device 1, and the one surface 3a of the second heat sink 3 is exposed from the sealing material 6. The second heat sink 3 is electrically connected to the first conductor portion 13 via the bonding material 5, and forms a current path of the semiconductor element 11 similarly to the first heat sink 2. In another cross section of FIG. 7, a part of the second heat sink 3 on the other surface 3b side extends to the outside of the sealing material 6, and serves two roles of a heat dissipation member and an electric wire. The second heat sink 3 may be referred to as a "second heat dissipation member".

The lead frame 4 is formed of, for example, a metal material such as Cu or Fe, and as illustrated in FIG. 7, is electrically connected to the metal thin film 154 covering a part of the extension wire 152 via the bonding material 5 in an exposed region of the semiconductor device 1, which is located outside the contour of the second heat sink 3. The lead frame 4 includes, for example, a plurality of leads as many as the second electrode pads 112, and each of a plurality of the leads is electrically connected to the extension wire 152.

For example, for these leads, a plurality of the adjacent leads are connected by a tie bar (not illustrated) before the formation of the sealing material 6, but after the formation of the sealing material 6, the tie bar is removed by press punching and the leads are separated. The lead frame 4 may be formed as the same member as the first heat sink 2 or the second heat sink 3, and may be connected by the tie bar (not illustrated) until the formation of the sealing material 6. Even in this case, the lead frame 4 is separated from the first heat sink 2 or the second heat sink 3 by removing the tie bar by press punching after the formation of the sealing material 6.

The bonding material 5 is a bonding material for bonding components of the semiconductor module to each other, and a conductive material such as solder is used for electrical connection. The bonding material 5 is not limited to the solder, but is at least different from a wire.

The sealing material 6 is formed of, for example, a thermosetting resin such as an epoxy resin, and covers the semiconductor device 1, a part of the heat sinks 2 and 3, a part of the lead frame 4, and the bonding material 5 as illustrated in FIG. 7. In a case where the sealing material 12 forming a part of the semiconductor device 1 is referred to as a "first sealing material", the sealing material 6 can be referred to as a "second sealing material" that covers the semiconductor device 1.

The semiconductor module has a structure in which the extension wire 152 of the semiconductor device 1 and the lead frame 4 are bonded by the bonding material 5 in a region outside of the contour of the second heat sink 3. Therefore, unlike a conventional semiconductor device, the wire connection between the semiconductor device 1 and the lead frame 4 becomes unnecessary. Since the wire is not used, it is not necessary to dispose, between the semiconductor device 1 and the second heat sink 3, a heat dissipation block for suppressing contact between the wire and the second heat sink 3. Accordingly, since the thickness of the semiconductor module can be reduced by a quantity of the heat dissipation blocks, and the thermal resistance of the heat dissipation block is eliminated, the thermal resistance from the semiconductor device 1 to the second heat sink 3 is reduced.

As described above, the semiconductor module using the semiconductor device 1 does not require the wire connection between the heat dissipation block and a member, and has a structure in which the thickness and the thermal resistance are reduced as compared with the related art. Since a short-circuit between the extension wire 152 of the semiconductor device 1 and the semiconductor element 11 of the semiconductor device 1 is suppressed, the reliability of the semiconductor module is also improved.

Figure 8:
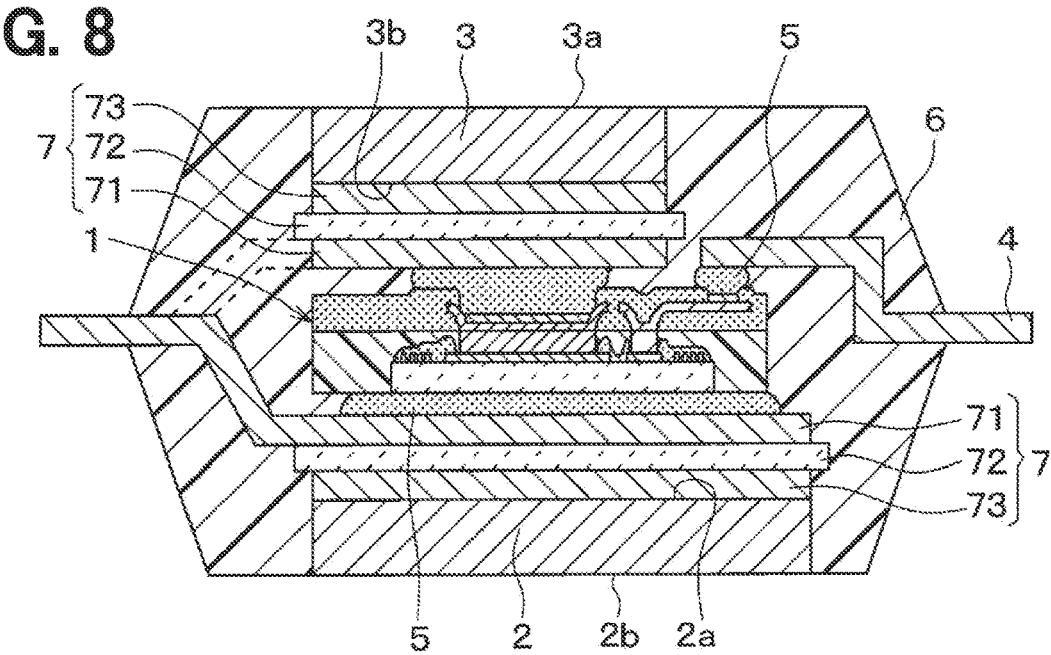
FIG. 8 is a cross-sectional view illustrating another example of a semiconductor module using the semiconductor device according to the first embodiment.

In the above-described example, all of the first and second heat dissipation members are formed by the heat sink, but the present disclosure is not limited to this. For example, as illustrated in FIG. 8, the first and second heat dissipation members may include a heat-transfer insulation substrate 7 and the heat sinks 2 and 3, and the heat-transfer insulation substrate 7 may be bonded to the semiconductor device 1.

The heat-transfer insulation substrate 7 includes an electric conduction portion 71, an insulation portion 72, and a heat conduction portion 73, these are stacked in this order, and the electric conduction portion 71 and the heat conduction portion 73 are separated by the insulation portion 72 to have an electrically independent configuration. In the heat-transfer insulation substrate 7, for example, the electric conduction portion 71 is mainly made of a metal material such as Cu, the insulation portion 72 is mainly made of an insulating material such as $Al_2O_3$ (alumina) or aluminum nitride (AlN), and the heat conduction portion 73 is mainly made of a metal material such as Cu. In the heat-transfer insulation substrate 7, the heat conduction portion 73 is bonded to the first heat sink 2 or the second heat sink 3 via the bonding material such as solder (not illustrated). As the heat-transfer insulation substrate 7, for example, a direct bonded copper (DBC) substrate can be used. In the heat-transfer insulation substrate 7, for example, a part of the electric conduction portion 71 is a wire connected to an external power supply, or is connected to another wire such as the lead frame 4, and can electrically communicate with the semiconductor element 11.

In this case, in the semiconductor module, the semiconductor device 1 and the heat sinks 2 and 3 are insulated from each other by the heat-transfer insulation substrate 7, and when the heat sinks 2 and 3 are connected to an external cooler, it is not necessary to separately interpose an insulation layer between the cooler and the semiconductor module. Therefore, the semiconductor module illustrated in FIG. 8 also has an effect of improving the reliability when connected to the external cooler. As described above, a part of the first and second heat dissipation members, which are connected to the semiconductor device 1, may be formed by the heat-transfer insulation substrate 7, and all of the first and second heat dissipation members may be formed by the heat-transfer insulation substrate 7.

According to the present embodiment, the semiconductor device 1 has a structure in which the redistribution layer 15 including the extension wire 152 is formed on the flat one surface 12a of the sealing material 12 covering the on-element insulation film 114 of the semiconductor element 11. The redistribution layer 15 is obtained by forming the first layer 1511 which is a part of the insulation layer 151 on the flat one surface 12a, and then forming the extension wire 152 on the first layer 1511 as a base having no step on a boundary between the side surface 11c of the semiconductor element 11 and the sealing material 12. Therefore, in the first layer 1511, the step-cut due to a step at the boundary between the side surface 11c of the semiconductor element 11 and the sealing material 12 does not occur, and thus the insulating property can be secured. Accordingly, the insulating property in the redistribution layer 15 is secured, the short-circuit between the semiconductor element 11 and the extension wire 152 is suppressed, and the semiconductor device 1 having the FOP structure with the improved reliability is obtained.

The semiconductor device 1 has an FOP structure in which the exposed portion of the extension wire 152 electrically connected to the second electrode pad 112 and another member such as the lead frame can be bonded to each other in a region outside the contour of the heat dissipation member while the heat dissipation member such as a heat sink and the first electrode pad 111 are connected. Therefore, the wire connection between the heat dissipation block and the members is not necessary by using the semiconductor device 1 in the semiconductor module, and the semiconductor device 1 has a structure applied for increase in thickness and increase in heat dissipation of the semiconductor module.

Second Embodiment

A semiconductor device 1 according to the second embodiment will be described with reference to FIG. 9.

Figure 9:
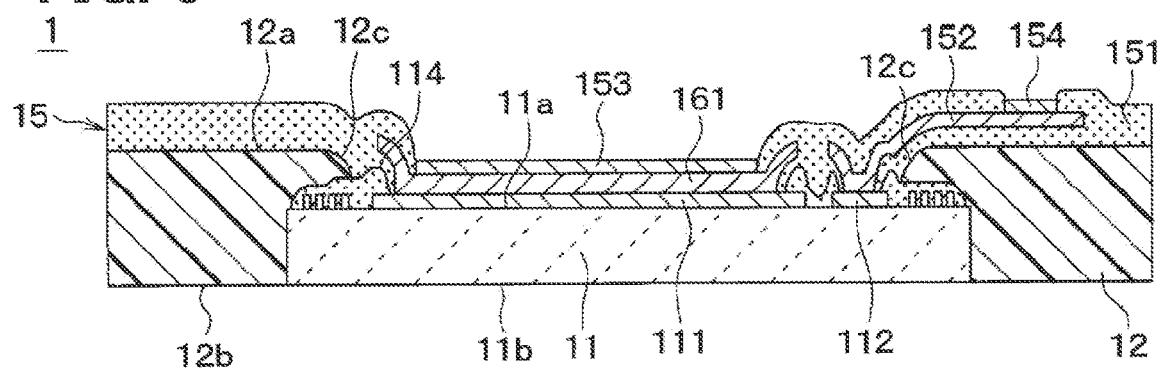
FIG. 9 is a cross-sectional view illustrating a configuration of a semiconductor device according to a second embodiment.

As illustrated in FIG. 9, the semiconductor device 1 of the present embodiment is different from that of the first embodiment in that a first conductor portion is located on the front surface 11a of the semiconductor element 11, a surface connected to the one surface 12a of the sealing material 12 is an "inner wall surface 12c", and the inner wall surface 12c has a curved surface shape curved in a cross-sectional view. In the present embodiment, the difference will be mainly described.

As illustrated in FIG. 9, for example, the inner wall surface 12c of the sealing material 12 has a curved surface shape in which a boundary portion between the one surface 12a and the inner wall surface 12c does not form a corner in a cross-sectional view. In other words, the sealing material 12 has an opening portion that exposes the front surface 11a side of the semiconductor element 11, and the inner wall surfaces 12c forming the opening portion have a cross-sectional shape having curvature. This is because a portion of the insulation layer 151, which covers the step portion between the one surface 12a of the sealing material 12 and the front surface 11a of the semiconductor element 11, is a "step covering portion", a crack is suppressed from being generated in the step covering portion, and the insulating property is secured. The details thereof will be described later in a manufacturing method of the semiconductor device 1 of the present embodiment.

<Manufacturing Method>

Next, an example of the manufacturing method of the semiconductor device 1 of the present embodiment will be described with reference to FIGS. 10A to 10K. Here, a difference from the manufacturing process of the semiconductor device 1 of the first embodiment will be mainly described.

Figure 10A:
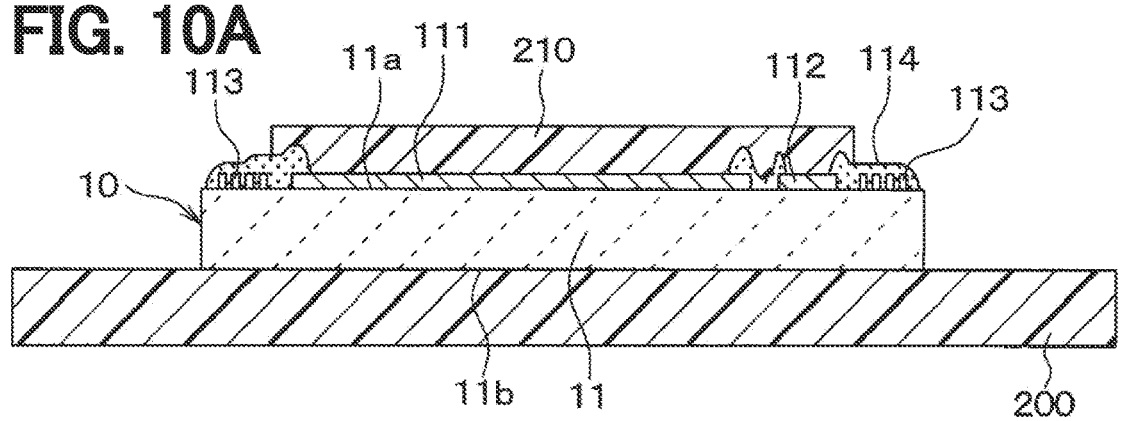
FIG. 10A is a cross-sectional view illustrating a temporary fixing process of a semiconductor substrate including a front surface protection material in a manufacturing process of the semiconductor device according to the second embodiment.

First, the semiconductor substrate 10 is prepared which includes, on the front surface 11a of the semiconductor element 11, the first electrode pad 111, the second electrode pad 112, and the on-element insulation film 114 covering the electric field relaxation layer 113 and the electric field relaxation layer 113. A temporary protection material 210 that covers the first electrode pad 111 and the second electrode pad 112 of the semiconductor element 11 is formed. As the temporary protection material 210, for example, an adhesive material, a photosensitive resin material, or the like can be used. As illustrated in FIG. 10A, the back surface 11b of the semiconductor element 11 in the semiconductor substrate 10 on which the temporary protection material 210 is formed is attached to the support substrate 200 to perform temporary fixing.

Figure 10B:
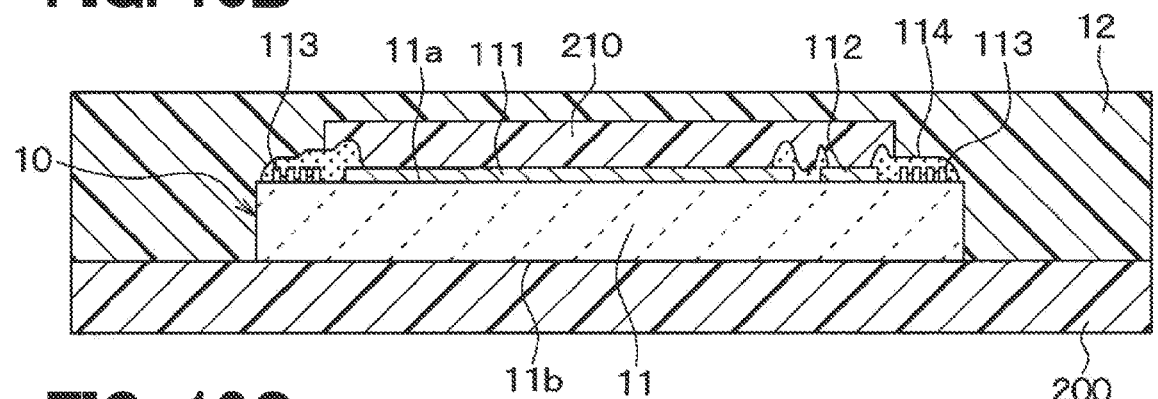
FIG. 10B is a cross-sectional view illustrating a manufacturing process subsequent to FIG. 10A.

Subsequently, as illustrated in FIG. 10B, a sealing material 12 that covers the semiconductor substrate 10 together with the temporary protection material 210 is formed by a method similar to that in the first embodiment. Thereafter, the semiconductor substrate 10 covered by the sealing material 12 is peeled off from the support substrate 200 by, for example, heat treatment.

Figure 10C:
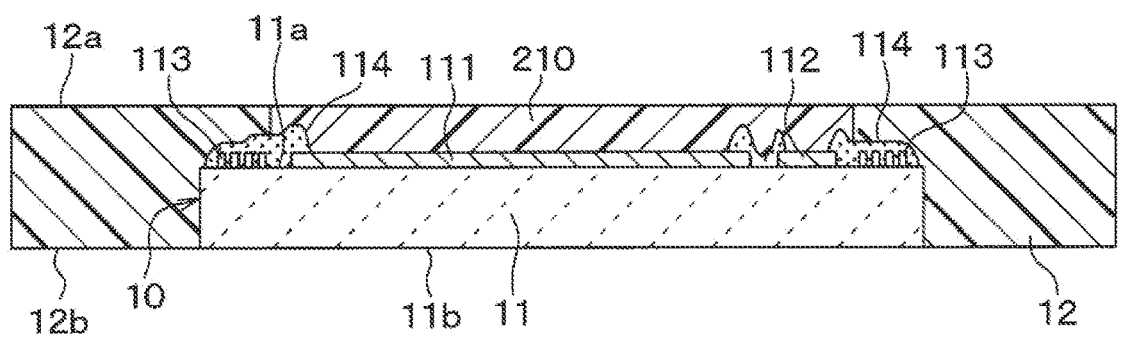
FIG. 10C is a cross-sectional view illustrating a manufacturing process subsequent to FIG. 10B.

Next, by the same method as in the first embodiment, as illustrated in FIG. 10C, the surface of the sealing material 12 covering the front surface 11a side of the semiconductor element 11 is ground by using a grinding tool such as a grinder (not illustrated), and the temporary protection material 210 is exposed from the sealing material 12. Accordingly, on the sealing material 12, the flat one surface 12a covering the on-element insulation film 114 and a part of the front surface 11a is formed. The grinding has been described as an example of the removal of the sealing material 12 for exposing the temporary protection material 210, but the example of the removal is not limited to this, and any other methods such as cutting, etching, and polishing can be adopted.

Figure 10D:
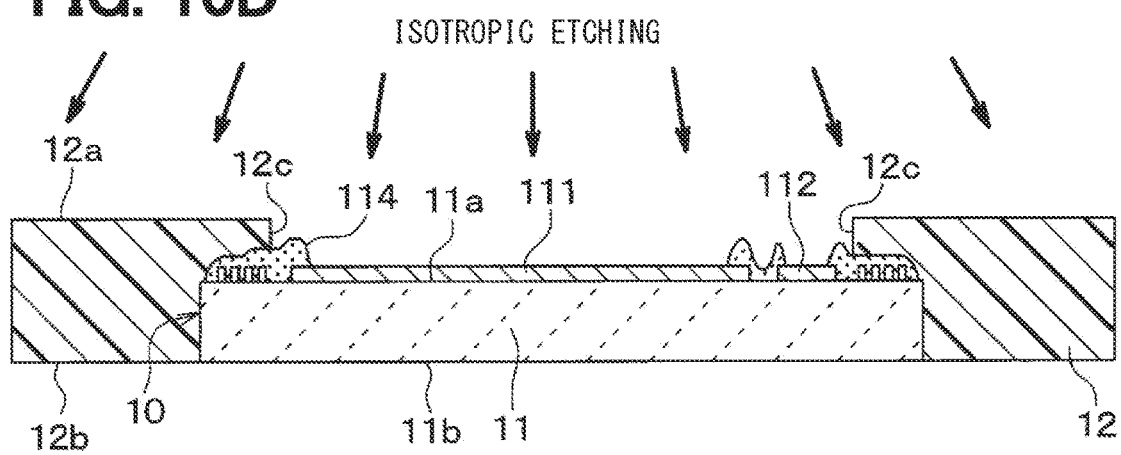
FIG. 10D is a cross-sectional view illustrating a manufacturing process subsequent to FIG. 10C.

Thereafter, a predetermined region including the first electrode pad 111 and the second electrode pad 112 on the semiconductor substrate 10 is exposed to the outside by removing the sealing material 12 by any method such as peeling off the sealing material 12 with a dicing tape or etching the sealing material 12. In this stage, as illustrated in FIG. 10D, the inner wall surface 12c of the sealing material 12 has a shape in which a boundary portion between the one surface 12a and the inner wall surface 12c form a corner portion in a cross-sectional view.

Figure 10E:
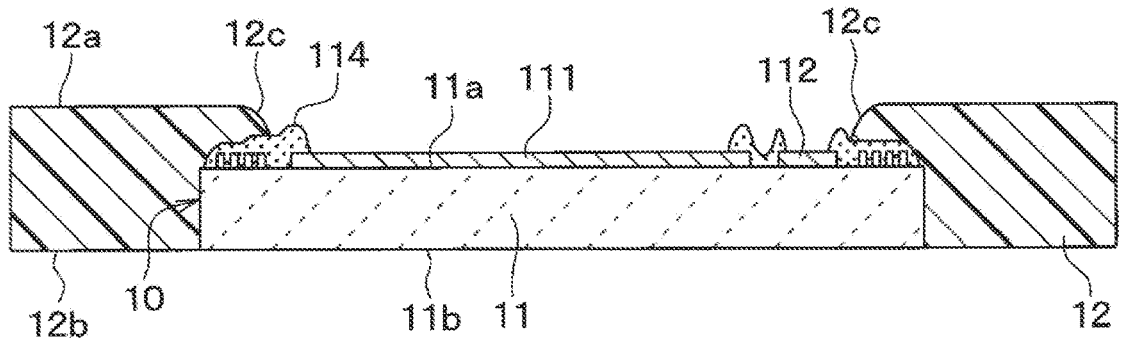
FIG. 10E is a cross-sectional view illustrating a manufacturing process subsequent to FIG. 10D.

For example, isotropic etching such as ashing treatment using oxygen is performed to remove a surface layer portion including the inner wall surface 12c of the sealing material 12 made of a resin material. Accordingly, for example, as illustrated in FIG. 10E, the sealing material 12 has a curved surface shape in which the inner wall surface 12c is curved in a cross-sectional view, and has a shape without a corner portion at a boundary portion between the one surface 12a and the inner wall surface 12c.

Figure 10F:
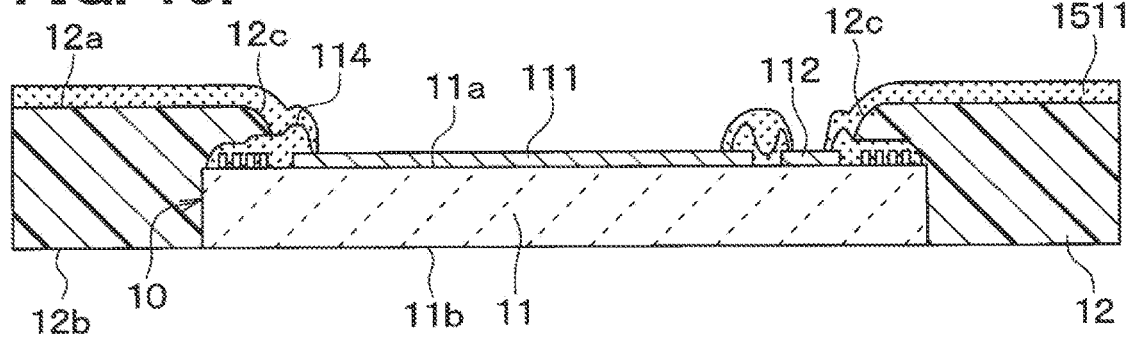
FIG. 10F is a cross-sectional view illustrating a manufacturing process subsequent to FIG. 10E.

Subsequently, for example, similarly to the first embodiment, a solution containing a resin material such as polyimide is applied by a spin coating method, and patterning is performed by a photolithography etching method to form a first layer 1511 as illustrated in FIG. 10F. In the present embodiment, the first layer 1511 has a predetermined pattern shape that exposes the first conductor portion 13 and the second conductor portion 14 of the semiconductor substrate 10, and covers the one surface 12a and the inner wall surface 12c of the sealing material 12.

Since the inner wall surface 12c has a curved surface shape curved in cross-sectional view, a portion of the first layer 1511 covering the inner wall surface 12c and the one surface 12a is suppressed from being locally thinned due to a boundary portion between the inner wall surface 12c and the one surface 12a. Specifically, since the region of the sealing material 12 from the one surface 12a to the inner wall surface 12c is gently inclined, the shape of the portion of the first layer 1511 covering the region is stabilized as compared with the case where the region has, for example, a right angle corner portion.

Figure 11:
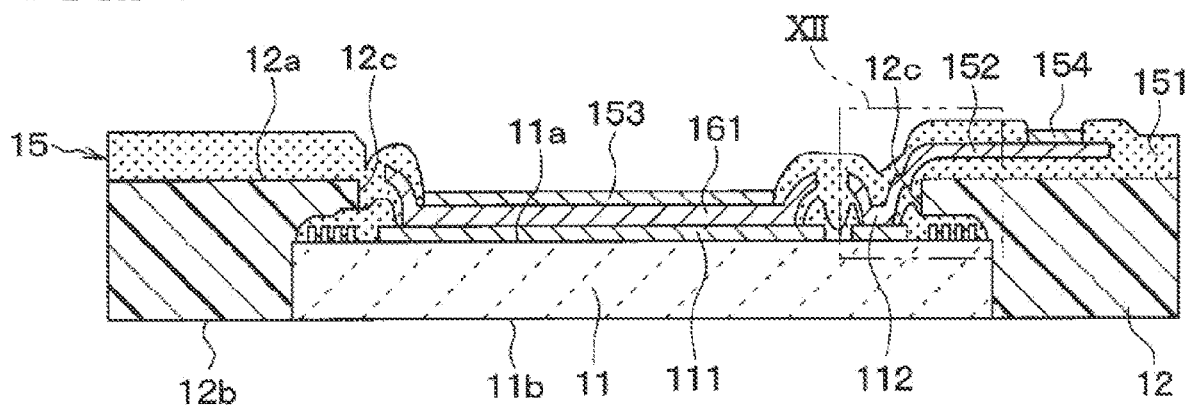
FIG. 11 is an explanatory view for explaining step-cut of an insulation layer in a case where a cross-sectional shape of an upper end of an inner wall surface of a sealing material is a right angle shape.
Figure 12:
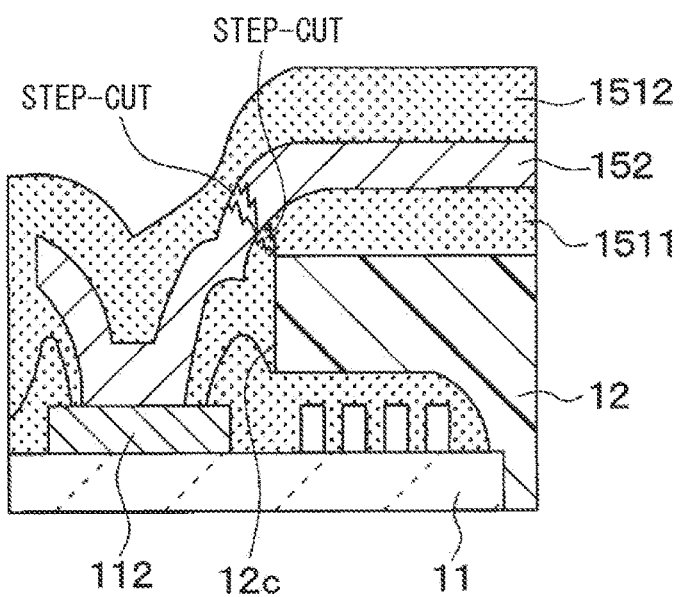
FIG. 12 is an enlarged cross-sectional view illustrating an XII region of FIG. 11.

For example, as illustrated in FIG. 11, in a case where the cross-sectional shape of the boundary portion between the inner wall surface 12c and the one surface 12a has a substantially right angle corner portion, the first layer 1511 covers the corner portion at the step portion of the sealing material 12. In this case, the height of the step portion between the one surface 12a of the sealing material 12 and the exposed portion of the semiconductor element 11 rapidly changes, and thus the first layer 1511 covering the step portion may be locally thinned. Specifically, in a portion of the redistribution layer 15 covering the step caused due to the sealing material 12, particularly, in a portion of the sealing material 12 covering a substantially right angle corner portion in cross-sectional view, as illustrated in FIG. 12, there is a possibility that a step-cut occurs in the first layer 1511 and the extension wire 152 formed on the first layer 1511. In a case where the step-cut occurs in the first layer 1511, there is a possibility that a short-circuit occurs between the extension wire 152 and the semiconductor element 11, and in a case where the step-cut occurs in the extension wire 152, a current flow failure occurs. The step-cut of the extension wire 152 may occur similarly even in a case where the first layer 1511 cannot follow the corner portion of the sealing material 12 and cannot cover the corner portion.

In the present embodiment, the generation of a crack in the first layer 1511 or another member disposed on the first layer 1511 due to the step between the one surface 12a and a portion of the semiconductor element 11 exposed from the sealing material 12 or the sealing material 12 is referred to as "step-cut".

On the other hand, as illustrated in FIG. 10E, in a case where the inner wall surface 12c has a curved cross-sectional surface shape, the change in height between the one surface 12a and the exposed portion of the semiconductor element 11 is gentle, and the first layer 1511 covering the one surface 12a is suppressed from being locally thinned. Therefore, the first layer 1511 has a shape in which the step-cut is suppressed and the insulating property is secured. Since the step-cut in the first layer 1511 is suppressed, the occurrence of a crack caused by the step-cut is suppressed in the extension wire 152 formed on the first layer 1511.

Figure 10G:
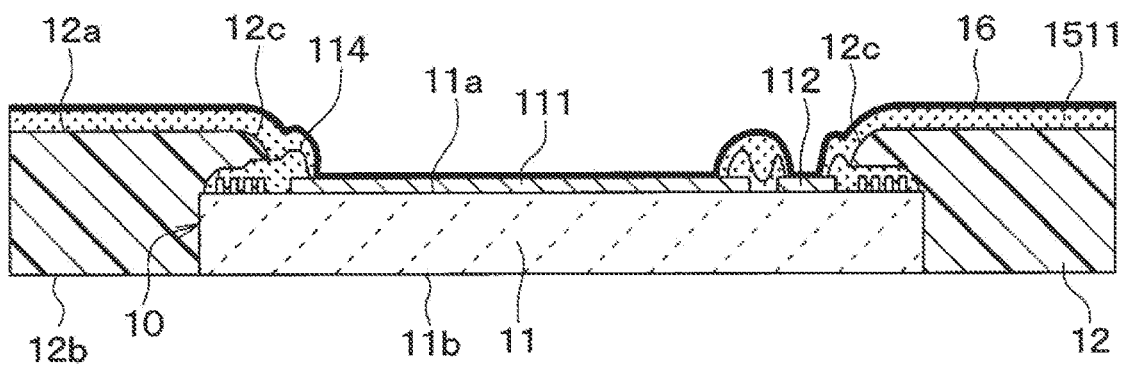
FIG. 10G is a cross-sectional view illustrating a manufacturing process subsequent to FIG. 10F.
Figure 10H:
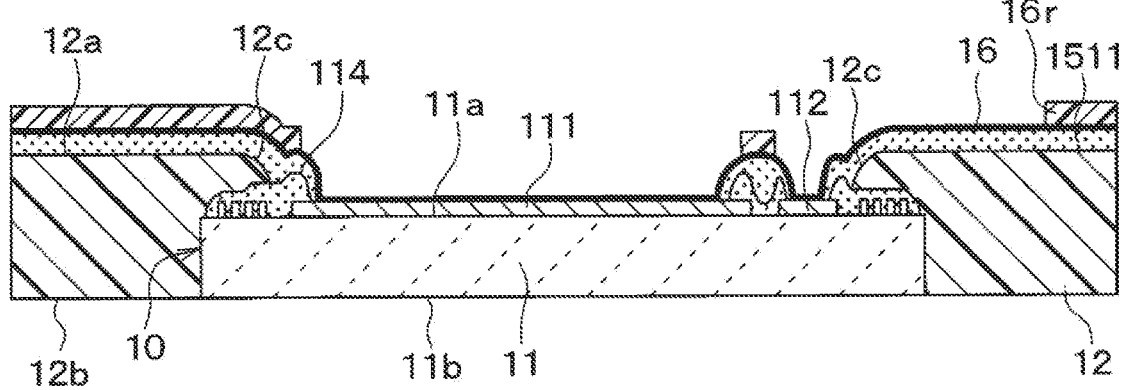
FIG. 10H is a cross-sectional view illustrating a manufacturing process subsequent to FIG. 10G.
Figure 10I:
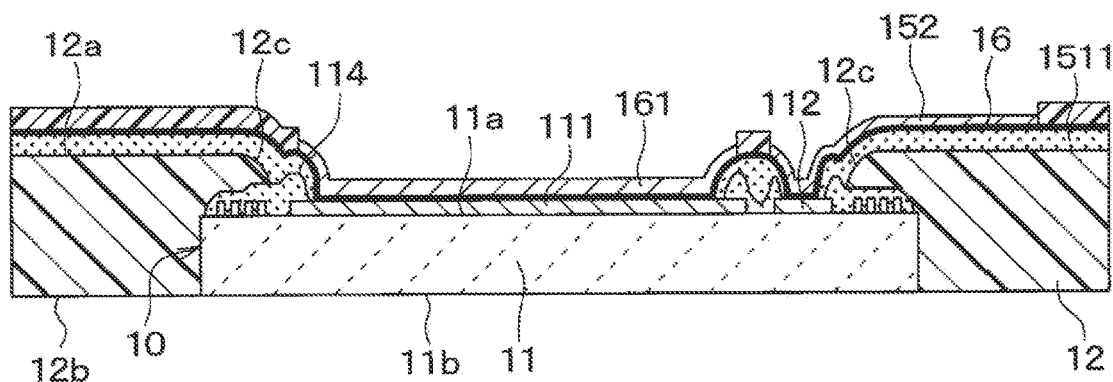
FIG. 10I is a cross-sectional view illustrating a manufacturing process subsequent to FIG. 10H.

Next, for example, as illustrated in FIG. 10G, the seed layer 16 covering the first layer 1511 and the electrode pads 111 and 112 is formed by the same method as that in the first embodiment. Thereafter, for example, as illustrated in FIG. 10H, the insulating resist layer 16r having a predetermined pattern shape partially covering the seed layer 16 is formed by a process similar to that of the first layer 1511. Subsequently, for example, as illustrated in FIG. 10I, the covering portion 161 covering the first electrode pad 111 and the extension wire 152 covering a part of the first layer 1511 and the second electrode pad 112 are formed by performing electrolytic plating.

Figure 10J:
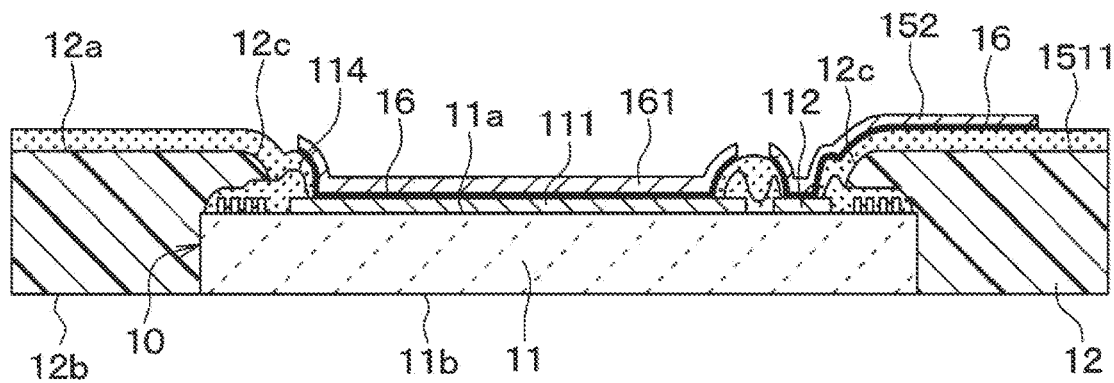
FIG. 10J is a cross-sectional view illustrating a manufacturing process subsequent to FIG. 10I.

For example, after the resist layer 16r is removed with a peeling solution, a portion of the seed layer 16 exposed by the removal of the resist layer 16r is removed with an etching solution. As a result, as illustrated in FIG. 10J, the covering portion 161 covering the first electrode pad 111 and the extension wire 152 covering the second electrode pad 112 and extending to a position outside of the contour of the semiconductor element 11 can be formed.

Figure 10K:
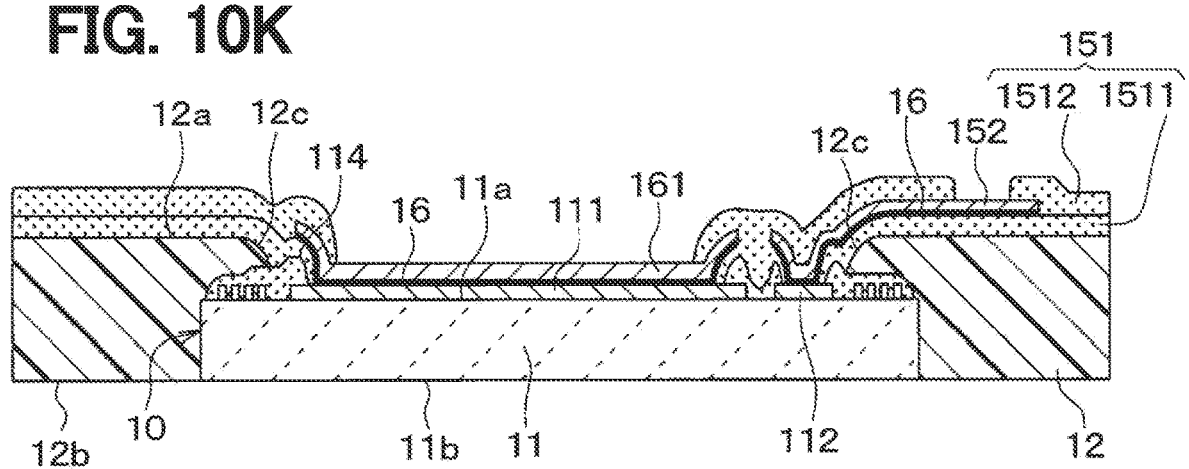
FIG. 10K is a cross-sectional view illustrating a manufacturing process subsequent to FIG. 10J.

Thereafter, for example, after the second layer 1512 is formed by a process similar to the process of forming the first layer 1511, patterning is performed by a photolithography etching method, and as illustrated in FIG. 10K, the covering portion 161 and a part of the extension wire 152 are exposed to the outside.

Finally, the metal thin films 153 and 154 covering the portions of the covering portion 161 and the extension wire 152 exposed from the second layer 1512 are formed by a process similar to the process of forming the covering portion 161 and the extension wire 152.

For example, the semiconductor device 1 of the present embodiment can be manufactured by the above-described processes.

According to the present embodiment, the semiconductor device 1 has a structure in which the inner wall surface 12c has a curved cross-sectional surface shape, the step-cut in the first layer 1511 which is a base of the extension wire 152 is suppressed, and a short-circuit between the extension wire 152 and the semiconductor element 11 is suppressed. Similarly to the first embodiment, the semiconductor device 1 has a structure in which the first layer 1511 and a part of the extension wire 152 are formed on the flat one surface 12a of the sealing material 12 covering the side surface 11c and a part of the front surface 11a of the semiconductor element 11. Therefore, also in the present embodiment, as compared with the case where the redistribution layer 15 is directly formed on the boundary step between the side surface 11c of the semiconductor element 11 and the sealing material 12, the short-circuit between the extension wire 152 and the semiconductor element 11 is suppressed, and the reliability is improved.

(Modification of Second Embodiment)

Figure 13:
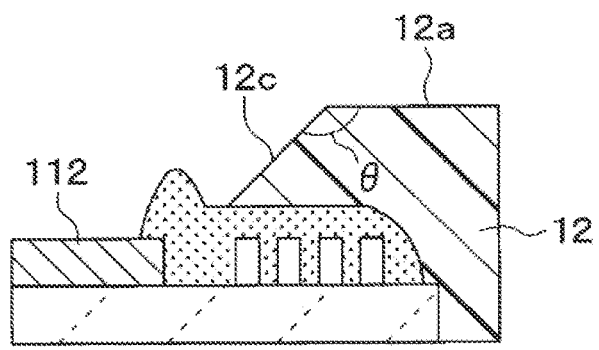
FIG. 13 is an enlarged cross-sectional view illustrating an example in which an inner wall surface of a sealing material has another cross-sectional shape.

The example in which the cross-sectional shape of the inner wall surface 12c is curved shape has been described above, the present disclosure is not limited to this. The inner wall surface 12c only needs to have a shape in which a step formed by the one surface 12a and the exposed portion of the semiconductor element 11 gently changes, and may have, for example, a tapered shape in which an intersection angle θ formed by the one surface 12a and the inner wall surface 12c is an obtuse angle as illustrated in FIG. 13. That is, even in a case where the inner wall surface 12c has a cross-sectional shape in which an upper end portion intersecting the one surface 12a of the sealing material 12 has a corner portion and the corner portion has an obtuse angle, the step-cut of the insulation layer 151 can be suppressed. Even in this case, the first layer 1511 of the insulation layer 151 can follow the corner portion of the sealing material 12, it is possible to suppress the first layer 1511 from being thinned at the corner portion of the sealing material 12 and suppress the step-cut of the extension wire 152.

The present modification also provides a semiconductor device that can obtain the same effects as those of the second embodiment.

Third Embodiment

A semiconductor device 1 according to the third embodiment will be described with reference to FIGS. 14 to 16B.

Figure 14:
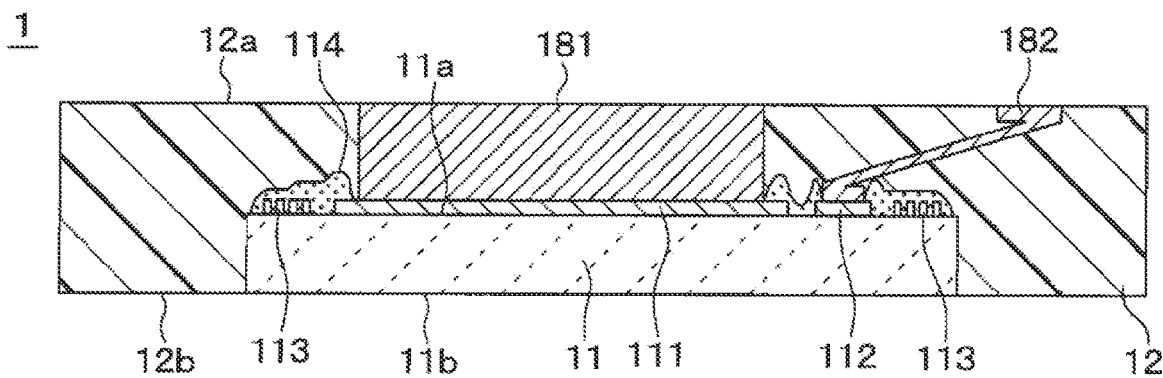
FIG. 14 is a cross-sectional view illustrating a configuration of a semiconductor device according to a third embodiment.

As illustrated in FIG. 14, for example, the semiconductor device 1 according to the present embodiment is different from that of the first embodiment in that the redistribution layer 15 is not provided, a first conductive portion 181 is connected to the first electrode pad 111, and a second conductive portion 182 is connected to the second electrode pad 112. In the present embodiment, the difference will be mainly described.

In the present embodiment, the sealing material 12 covers the front surface 11a and the side surface of the semiconductor element 11, and the one surface 12a covering the front surface 11a side is exposed to the outside. In other words, in the present embodiment, a part of the sealing material 12 covers the first conductive portion 181 and the second conductive portion 182, and serves a role corresponding to the insulation layer 151 of the redistribution layer 15.

As illustrated in FIG. 14, the first conductive portion 181 is connected to the first electrode pad 111, and an end surface of the first conductive portion 181 on a side opposite to the first electrode pad 111 is exposed from the sealing material 12 in a region inside of the contour of the semiconductor element 11. The first conductive portion 181 is a member corresponding to the first conductor portion 13 in the first embodiment.

As illustrated in FIG. 14, the second conductive portion 182 is connected to the second electrode pad 112, and an end surface of the second conductive portion 182 on a side opposite to the second electrode pad 112 is exposed from the sealing material 12 in a region outside of the contour of the semiconductor element 11. The second conductive portion 182 is a member corresponding to the second conductor portion 14 and the extension wire 152 in the first embodiment. The second conductive portion 182 forms one member together with the first conductive portion 181 in the middle of manufacturing the semiconductor device 1 of the present embodiment, and in the process of removing the sealing material 12, the second conductive portion 182 is separated from the first conductive portion 181 to be a separated portion. Therefore, in the second conductive portion 182, a portion from a portion connected to the second electrode pad 112 to a portion exposed from the sealing material 12 is formed by a single member formed of the same material as that of the first conductive portion 181.

Figure 15A:
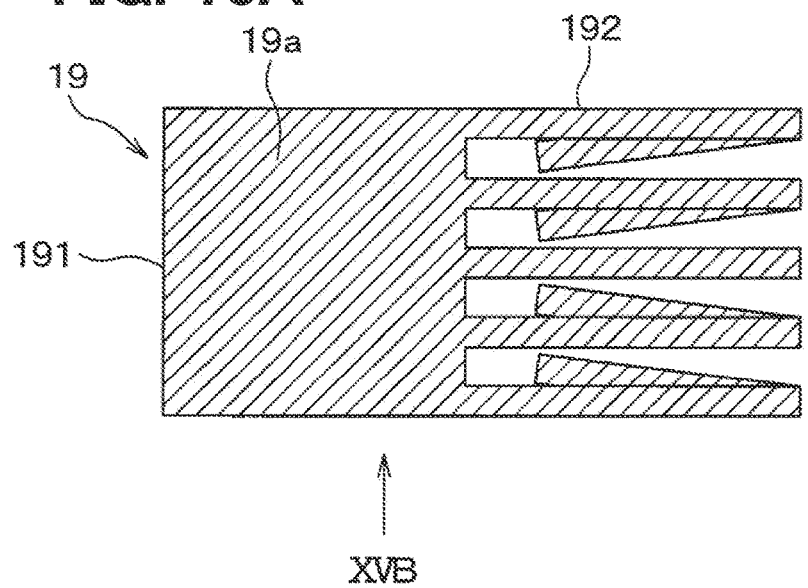
FIG. 15A is a top view of a conductive member bonded to a semiconductor substrate as viewed from above.
Figure 15B:
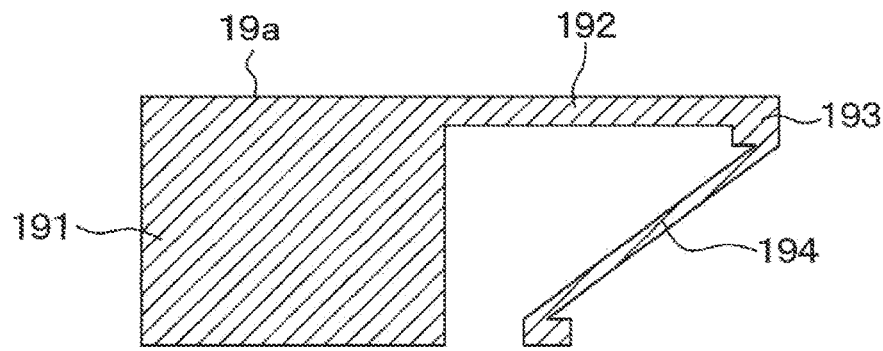
FIG. 15B is a view as viewed in an arrow direction from an XVB direction of FIG. 15A.

Specifically, the first conductive portion 181 and the second conductive portion 182 are, for example, members forming a conductive member 19 illustrated in FIGS. 15A and 15B, and portion connecting the first conductive portion 181 with the second conductive portion 182 is removed in the middle of the manufacturing process of the semiconductor device 1 to be separated portions.

For example, as illustrated in FIG. 15A or 15B, the conductive member 19 includes a thick portion 191, a plurality of first thin portions 192, a plurality of middle portions 193, and a plurality of second thin portions 194. As illustrated in FIG. 15B, the conductive member 19 includes a plurality of the first thin portions 192 extending to the outside from a surface on an upper end side of the thick portion 191, that is, an upper end surface 19a of the thick portion 191, and as illustrated in FIG. 15A, a plurality of the first thin portions 192 are disposed in parallel to be separated from each other in the extending direction. In the conductive member 19, the thick portion 191 has the largest thickness, and each of the middle portions 193 has the second largest thickness after the thick portion 191. The conductive member 19 includes the first thin portions 192 and the second thin portions 194 which have a thickness smaller than that of the middle portions 193, and each of the second thin portions 194 extends from each of the middle portions 193 toward a lower end surface of the thick portion 191.

The conductive member 19 can be manufactured by, for example, a method of preparing a metal plate of Cu, partially thinning the metal plate by etching to form portions corresponding to the first thin portion 192, the middle portion 193, and the second thin portion 194, and then performing punching and bending by pressing. In this case, for example, a gap is formed in an extension portion formed by the first thin portion 192, the middle portion 193, and the second thin portion 194 by press punching, and the extension portion are separated into a plurality of extension portions. Thereafter, a plurality of the second thin portions 194 are bent toward a surface on a lower end side of the thick portion 191 by press-bending, and thus the conductive member 19 illustrated in FIG. 15A or 15B is obtained.

The bending direction of a plurality of the second thin portions 194 is appropriately determined according to the arrangement of the second electrode pad 112 of the semiconductor element 11. Distal ends of a plurality of the second thin portions 194 on the opposite side of the middle portions 193 are, for example, directed in different directions as illustrated in FIG. 15A.

<Manufacturing Method>

Figure 16A:
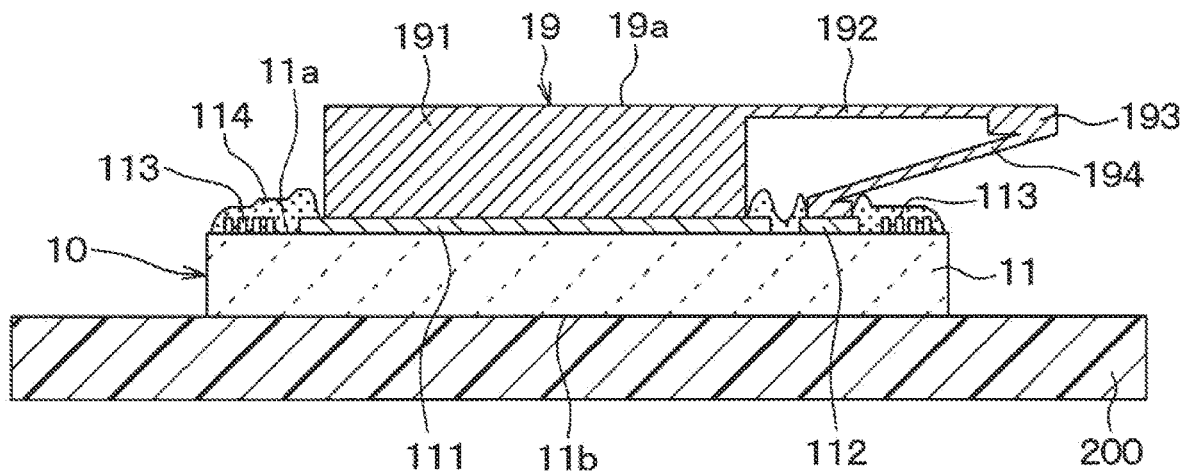
FIG. 16A is a cross-sectional view illustrating a temporary fixing process of a semiconductor substrate to which a conductive member is bonded in a manufacturing process of the semiconductor device according to the third embodiment.

Next, an example of the manufacturing method of the semiconductor device 1 of the present embodiment will be described with reference to FIGS. 16A and 16B. Here, the manufacturing process different from that of the first embodiment will be mainly described.

First, the semiconductor substrate 10 which includes, on the front surface 11a of the semiconductor element 11, the first electrode pad 111, the second electrode pad 112, and the on-element insulation film 114 covering the electric field relaxation layer 113 and the electric field relaxation layer 113 and the conductive member 19 are prepared. The thick portion 191 is connected to the first electrode pad 111 of the semiconductor element 11, and the distal end portions of the second thin portions 194 are connected to the second electrode pad 112 by a bonding material such as solder (not illustrated). Thereafter, as illustrated in FIG. 16A, the back surface 11b of the semiconductor element 11 in the semiconductor substrate 10 to which the conductive member 19 is connected is attached to the support substrate 200 to perform temporary fixing.

Figure 16B:
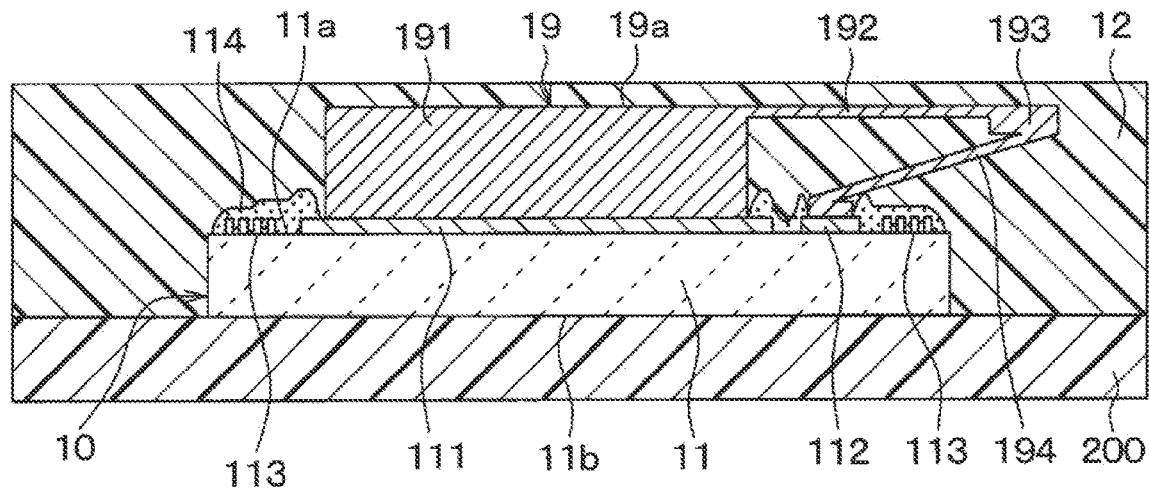
FIG. 16B is a cross-sectional view illustrating a manufacturing process subsequent to FIG. 16A.

Subsequently, as in the first embodiment, the sealing material 12 that covers the semiconductor substrate 10 together with the conductive member 19 is molded by compression molding as illustrated in FIG. 16B by using a mold (not illustrated).

Next, the sealing material 12 is ground from the surface of the sealing material 12 on the side covering the conductive member 19 by a grinding tool such as a grinder (not illustrated) to expose the conductive member 19 from the sealing material 12. In the process of grinding the sealing material 12, the first thin portions 192 are completely removed and the middle portions 193 are partially left. As a result, the thick portion 191, the middle portions 193, and the second thin portions 194 are separated, and the first conductive portion 181 and the second conductive portion 182 are formed. Here, grinding using a grinding tool such as a grinder (not illustrated) has been described as an example of the partial removal of the sealing material 12 and the conductive member 19, but the present disclosure is not limited to this, for example, any other methods such as cutting, etching, and polishing may be adopted.

For example, the semiconductor device 1 of the present embodiment can be manufactured by the above-described manufacturing method.

According to the present embodiment, the conductive member 19 having the second conductive portion 182 functioning as the extension wire 152 is formed before the formation of the sealing material 12. Therefore, the manufacturing method is a manufacturing method in which the second conductive portion 182 is not affected by a boundary between the side surface 11c of the semiconductor element 11 and the sealing material 12, the insulation failure is suppressed, and the short-circuit between the second conductive portion 182 and the semiconductor element 11 does not occur. Since it is not necessary to form the redistribution layer 15, and the number of manufacturing processes is reduced as compared with the first embodiment, a structure with a reduced manufacturing cost is obtained.

Other Embodiments

Although the present disclosure has been described in accordance with examples, it is understood that the present disclosure is not limited to the examples and configurations. The present disclosure also includes various modifications and the modifications within an equivalent range. In addition, various combinations and modes, and other combinations and modes including only one element, more elements, or less elements are also within the scope and idea of the present disclosure.

Figure 17:
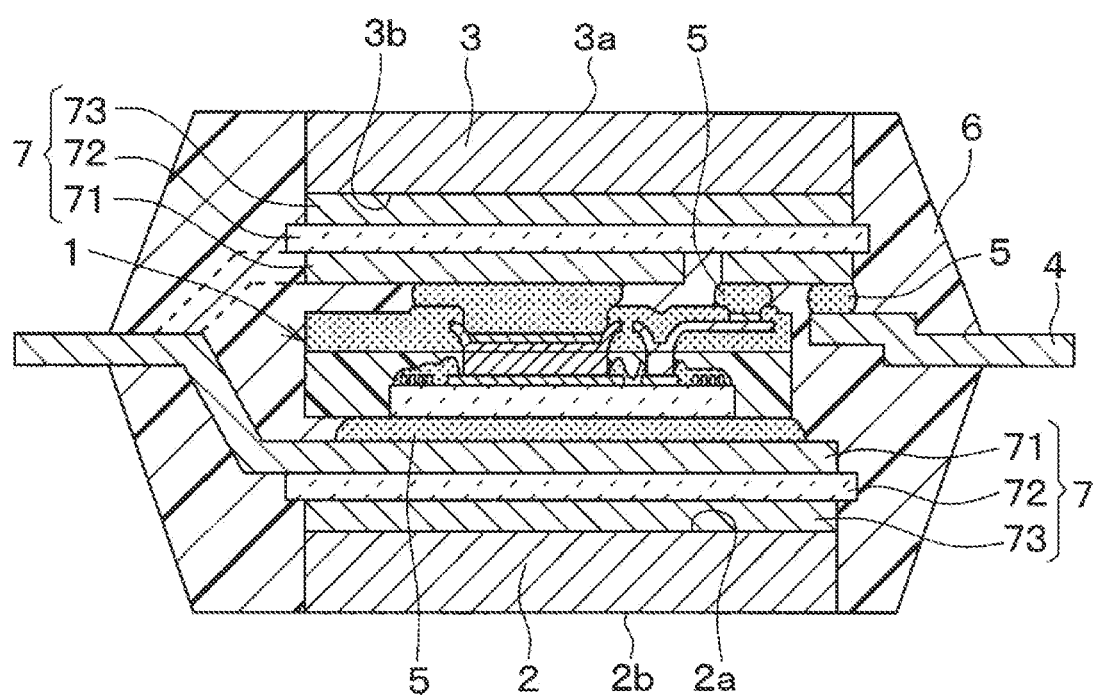
FIG. 17 is a cross-sectional view illustrating an example of a semiconductor module according to another embodiment.

For example, in the first embodiment, the structure in which the second external electrode of the semiconductor device 1 is the exposed region disposed outside of the contour of the second heat sink 3 and the lead frame 4 is connected to the second external electrode in the exposed region has been described as an example of the semiconductor module, but the present disclosure is not limited to this. In a case where the second heat dissipation member has the heat-transfer insulation substrate 7, for example, as illustrated in FIG. 17, the semiconductor module may be provided in which the second external electrode of the semiconductor device 1 and the lead frame 4 are connected via the heat-transfer insulation substrate 7. In this case, the electric conduction portion 71 of the heat-transfer insulation substrate 7 has an arbitrary pattern shape in which a portion connected to the first external electrode of the semiconductor device 1 and a portion connected to the second external electrode are electrically independent from each other. A part of the lead frame 4 is disposed in a region inside of the contour of the second heat dissipation member, and is electrically connected to a portion of the electric conduction portion 71 connected to the second external electrode via the bonding material 5, and thus the lead frame 4 is electrically connected to the second external electrode. As described above, the configuration of the semiconductor module using the semiconductor device 1 may be appropriately changed according to the heat dissipation member. The same applies to the case of using the semiconductor device 1 of each of the other embodiments in addition to the case of using the semiconductor device 1 of the first embodiment.

What is claimed is:

1. A semiconductor device comprising:
   a semiconductor element that has, on a front surface, a first electrode pad and a plurality of second electrode pads, and generates a current in a direction connecting the front surface and a back surface;
   a sealing material that is made of an insulating resin material and covers a part of the front surface and a side surface of the semiconductor element;
   an extension wire that is disposed above the semiconductor element and inside the sealing material or on the sealing material, electrically connected to at least one of the second electrode pads, and extends from a position inside of a contour of the semiconductor element to a position outside of the contour of the semiconductor element; and
   an insulation layer that is made of an insulating resin material different from the insulating resin material of the sealing material, wherein the insulation layer is disposed to cover a top surface of the sealing material that covers a front surface side of the semiconductor element.

2. The semiconductor device according to claim 1, further comprising:
   a first conductor portion that is connected to the first electrode pad, extends directly on the first electrode pad, and is exposed from the sealing material; and
   a second conductor portion that is connected to at least one of the second electrode pads, extends toward an upper portion of the at least one of the second electrode pads, and is exposed from the sealing material, wherein the extension wire is connected to the second conductor portion.

3. The semiconductor device according to claim 2, wherein
   the first conductor portion is provided by a single member, and has an exposed surface exposed from the sealing material on a side opposite to the first electrode pad,
   the second conductor portion is provided by a single member formed of the same material as that of the first conductor portion,
   a part of the second conductor portion constitutes the extension wire, and
   the second conductor portion has an exposed surface exposed from the sealing material on a side opposite to the second electrode pad.

4. The semiconductor device according to claim 1, wherein
   the semiconductor element has a first external electrode that is electrically connected to the first electrode pad and exposed on a side opposite to the first electrode pad, and a second external electrode that is electrically connected to the second electrode pad and exposed on a side opposite to the second electrode pad, and
   the first external electrode is disposed at a distance from the second external electrode, and has a larger planar size than the second external electrode.

5. The semiconductor device according to claim 1, wherein
   the extension wire is made of a conductive material containing any one of Cu, Al, Ti, Au, Ag, Pd, W, Ni, Zn, and Pb as a main component.

6. The semiconductor device according to claim 1, wherein
   the insulation layer includes a first layer and a second layer, the first layer being adjacent to the top surface of the sealing material, and the second layer being disposed above the extension wire, and
   the first layer has a larger thickness than the second layer.

7. The semiconductor device according to claim 2, wherein
   a part of the second conductor portion constitutes the extension wire, and
   the second conductor portion is made of a conductive material different from that of the first conductor portion.

8. The semiconductor device according to claim 1, wherein
   the sealing material has an inner wall surface located above the front surface of the semiconductor element and connecting to the top surface, and
   the inner wall surface has a curved surface shape at an upper end portion connecting to the top surface.

9. The semiconductor device according to claim 1, wherein
   the sealing material has an inner wall surface located above the front surface of the semiconductor element,
   an upper end portion of the inner wall surface connects to the top surface and defines an intersection angle with respect to the top surface, and
   the intersection angle is an obtuse angle.

10. A semiconductor device comprising:
    a semiconductor element that has, on a front surface, a first electrode pad and a plurality of second electrode pads, and generates a current in a direction connecting the front surface and a back surface;
    a sealing material that is made of an insulating resin material and covers a part of the front surface and a side surface of the semiconductor element;
    an extension wire that is disposed above the semiconductor element and inside the sealing material or on the sealing material, electrically connected to at least one of the second electrode pads, and extends from a position inside of a contour of the semiconductor element to a position outside of the contour of the semiconductor element;

a first conductor portion that is connected to the first electrode pad, extends directly on the first electrode pad, and is exposed from the sealing material; and a second conductor portion that is connected to at least one of the second electrode pads, extends toward an upper portion of the at least one of the second electrode pads, and is exposed from the sealing material, wherein the extension wire is connected to the second conductor portion, a part of the second conductor portion constitutes the extension wire, and the second conductor portion is made of a conductive material different from that of the first conductor portion.

11. A semiconductor device comprising:

a semiconductor element that has, on a front surface, a first electrode pad and a plurality of second electrode pads, and generates a current in a direction connecting the front surface and a back surface;

a sealing material that is made of an insulating resin material and covers a part of the front surface and a side surface of the semiconductor element; and an extension wire that is disposed above the semiconductor element and inside the sealing material or on the sealing material, electrically connected to at least one of the second electrode pads, and extends from a position inside of a contour of the semiconductor element to a position outside of the contour of the semiconductor element, wherein the sealing material has a top surface covering a front surface side of the semiconductor element and an inner wall surface located above the front surface of the semiconductor element and connecting to the top surface, and the inner wall surface has a curved surface shape at an upper end portion connecting to the top surface.

* * * * *